US009105714B2

(12) United States Patent
Hu et al.

(10) Patent No.: US 9,105,714 B2
(45) Date of Patent: Aug. 11, 2015

(54) STABILIZATION STRUCTURE INCLUDING SACRIFICIAL RELEASE LAYER AND STAGING BOLLARDS

(71) Applicant: LUXVUE TECHNOLOGY CORPORATION, Santa Clara, CA (US)

(72) Inventors: Hsin-Hua Hu, Los Altos, CA (US); Andreas Bibl, Los Altos, CA (US)

(73) Assignee: LUXVUE TECHNOLOGY CORPORATION, Santa Clara, CA (US)

(*) Notice: Subject to any disclaimer, the term of this patent is extended or adjusted under 35 U.S.C. 154(b) by 73 days.

(21) Appl. No.: 13/754,739

(22) Filed: Jan. 30, 2013

(65) Prior Publication Data
US 2014/0159066 A1 Jun. 12, 2014

Related U.S. Application Data

(60) Provisional application No. 61/735,957, filed on Dec. 11, 2012.

(51) Int. Cl.
H01L 21/78 (2006.01)
H01L 27/15 (2006.01)
H01L 25/075 (2006.01)
H01L 33/00 (2010.01)

(52) U.S. Cl.
CPC ........ *H01L 21/7806* (2013.01); *H01L 25/0753* (2013.01); *H01L 27/15* (2013.01); *H01L 33/0079* (2013.01)

(58) Field of Classification Search
None
See application file for complete search history.

(56) References Cited

U.S. PATENT DOCUMENTS

| | | |
|---|---|---|
| 5,592,358 A | 1/1997 | Shamouilian et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,319,778 B1 | 11/2001 | Chen et al. |
| 6,335,263 B1 | 1/2002 | Cheung et al. |
| 6,403,985 B1 | 6/2002 | Fan et al. |
| 6,410,942 B1 * | 6/2002 | Thibeault et al. ............... 257/88 |
| 6,420,242 B1 | 7/2002 | Cheung et al. |
| 6,521,511 B1 | 2/2003 | Inoue et al. |
| 6,558,109 B2 | 5/2003 | Gibbel |

(Continued)

FOREIGN PATENT DOCUMENTS

JP 3406207 5/1999
WO WO 2011/123285 10/2011

OTHER PUBLICATIONS

"Cyclotene Advanced Electronic Resins—Processing Procedures for BCB Adhesion," The Dow Chemical Company, Revised Jun. 2007, pp. 1-10.

(Continued)

*Primary Examiner* — Johannes P Mondt
(74) *Attorney, Agent, or Firm* — Blakely, Sokoloff, Taylor & Zafman LLP

(57) ABSTRACT

A method and structure for stabilizing an array of micro devices is disclosed. The array of micro devices is within an array of staging cavities on a carrier substrate. Each micro device is laterally retained between a plurality of staging bollards of a corresponding staging cavity.

18 Claims, 20 Drawing Sheets

(56) References Cited

U.S. PATENT DOCUMENTS

| | | | |
|---|---|---|---|
| 6,586,875 | B1 | 7/2003 | Chen et al. |
| 6,613,610 | B2 | 9/2003 | Iwafuchi et al. |
| 6,629,553 | B2 | 10/2003 | Odashima et al. |
| 6,670,038 | B2 | 12/2003 | Sun et al. |
| 6,762,069 | B2 | 7/2004 | Huang et al. |
| 6,786,390 | B2 | 9/2004 | Yang et al. |
| 6,878,607 | B2 | 4/2005 | Inoue et al. |
| 7,015,513 | B2 * | 3/2006 | Hsieh .............................. 257/99 |
| 7,033,842 | B2 | 4/2006 | Haji et al. |
| 7,148,127 | B2 | 12/2006 | Oohata et al. |
| 7,208,337 | B2 | 4/2007 | Eisert et al. |
| 7,353,596 | B2 | 4/2008 | Shida et al. |
| 7,358,158 | B2 | 4/2008 | Aihara et al. |
| 7,560,738 | B2 | 7/2009 | Liu |
| 7,585,703 | B2 | 9/2009 | Matsumura et al. |
| 7,723,764 | B2 | 5/2010 | Oohata et al. |
| 7,795,629 | B2 | 9/2010 | Watanabe et al. |
| 7,797,820 | B2 | 9/2010 | Shida et al. |
| 7,838,410 | B2 | 11/2010 | Hirao et al. |
| 7,880,184 | B2 | 2/2011 | Iwafuchi et al. |
| 7,884,543 | B2 | 2/2011 | Doi |
| 7,888,690 | B2 | 2/2011 | Iwafuchi et al. |
| 7,906,787 | B2 | 3/2011 | Kang |
| 7,910,945 | B2 | 3/2011 | Donofrio et al. |
| 7,927,976 | B2 | 4/2011 | Menard |
| 7,928,465 | B2 | 4/2011 | Lee et al. |
| 7,972,875 | B2 * | 7/2011 | Rogers et al. .................. 438/21 |
| 7,999,454 | B2 | 8/2011 | Winters et al. |
| 8,023,248 | B2 | 9/2011 | Yonekura et al. |
| 8,333,860 | B1 | 12/2012 | Bibl et al. |
| 8,349,116 | B1 | 1/2013 | Bibl et al. |
| 2001/0029088 | A1 | 10/2001 | Odajima et al. |
| 2002/0076848 | A1 | 6/2002 | Spooner et al. |
| 2003/0177633 | A1 | 9/2003 | Haji et al. |
| 2006/0157721 | A1 * | 7/2006 | Tran et al. ...................... 257/98 |
| 2007/0166851 | A1 * | 7/2007 | Tran et al. ...................... 438/22 |
| 2008/0163481 | A1 | 7/2008 | Shida et al. |
| 2008/0315236 | A1 | 12/2008 | Lu et al. |
| 2009/0068774 | A1 | 3/2009 | Slater et al. |
| 2009/0202197 | A1 * | 8/2009 | Heinz-Gunter ................. 385/14 |
| 2009/0314991 | A1 | 12/2009 | Cho et al. |
| 2010/0171094 | A1 | 7/2010 | Lu et al. |
| 2010/0188794 | A1 | 7/2010 | Park et al. |
| 2010/0203661 | A1 | 8/2010 | Hodota |
| 2010/0244077 | A1 | 9/2010 | Yao |
| 2010/0248484 | A1 | 9/2010 | Bower et al. |
| 2011/0003410 | A1 * | 1/2011 | Tsay et al. ...................... 438/27 |
| 2011/0136324 | A1 * | 6/2011 | Ashdown et al. ............. 438/464 |
| 2012/0064642 | A1 | 3/2012 | Huang et al. |
| 2012/0134065 | A1 | 5/2012 | Furuya et al. |

OTHER PUBLICATIONS

Niklaus, et al., "Low-temperature full wafer adhesive bonding," Institute of Physics Bonding, Journal of Micromechanics and Microengineering, vol. 11, 2001, pp. 100-107.

Wohrmann, et al., "Low Temperature Cure of BCB and the Influence on the Mechanical Stress," 2011 Electronic Components and Technology Conference, pp. 392-400.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maastricht, The Netherlands. Published in the Technical Digest, ISBN 0-7803-8265-X, pp. 717-720, 4 pgs.

* cited by examiner

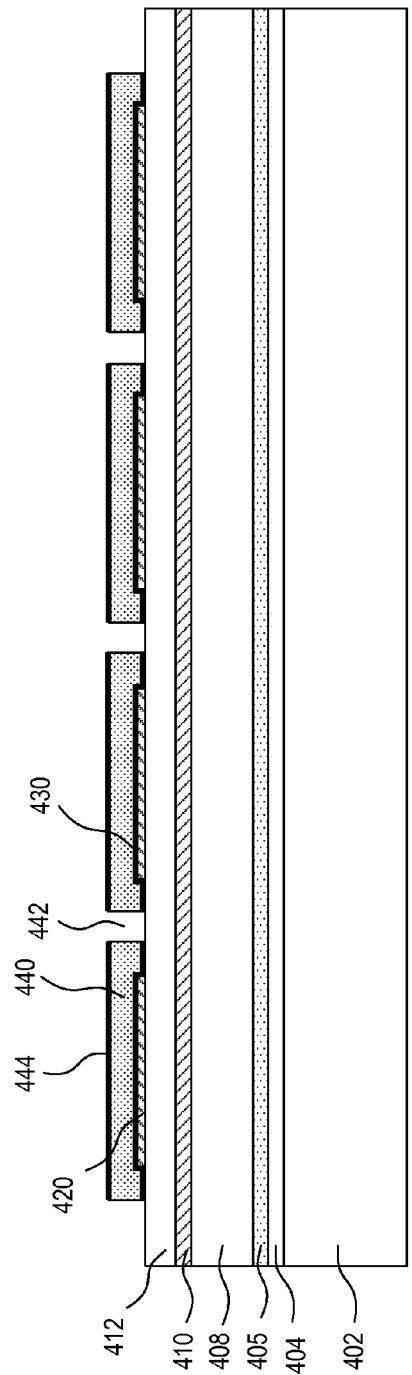
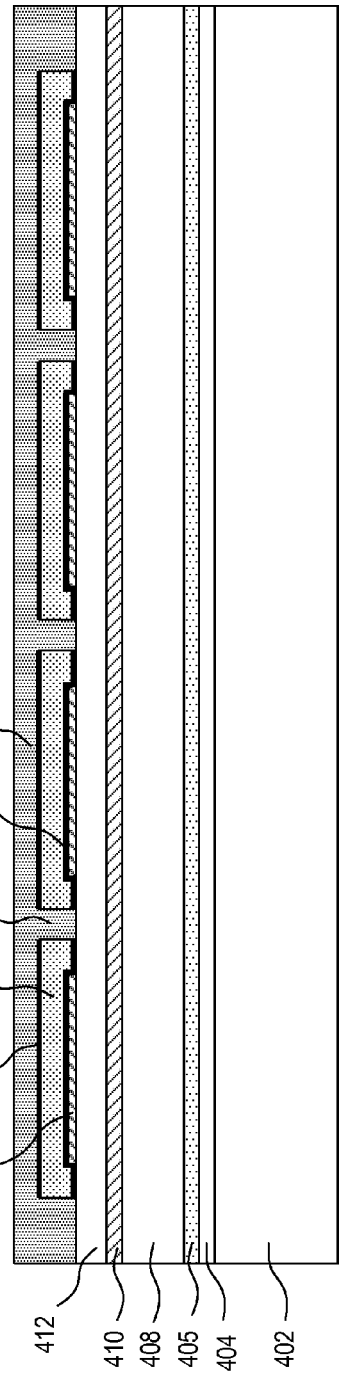
FIG. 3C
FIG. 3D

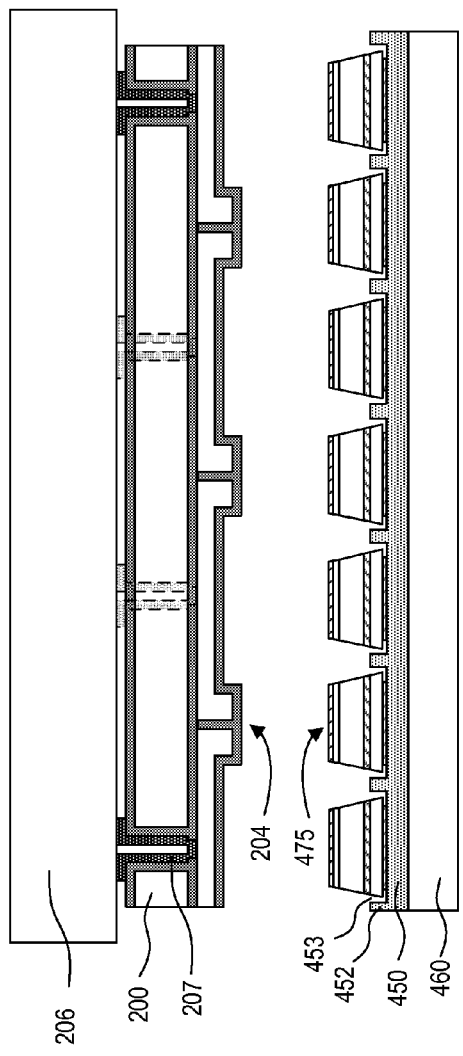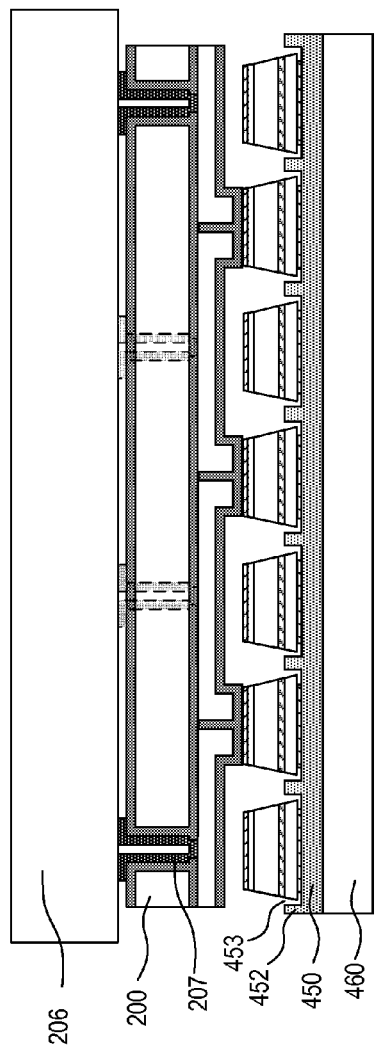
FIG. 4A
FIG. 4B

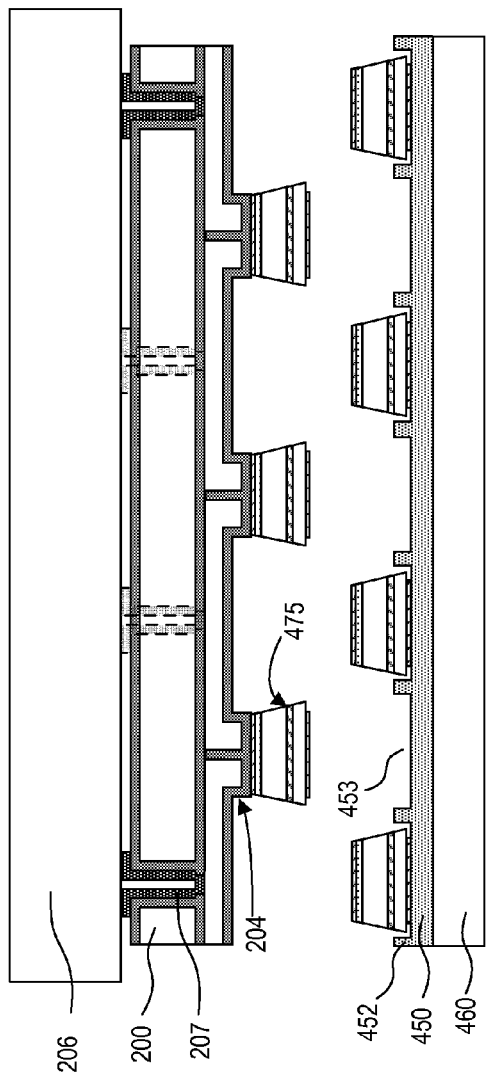
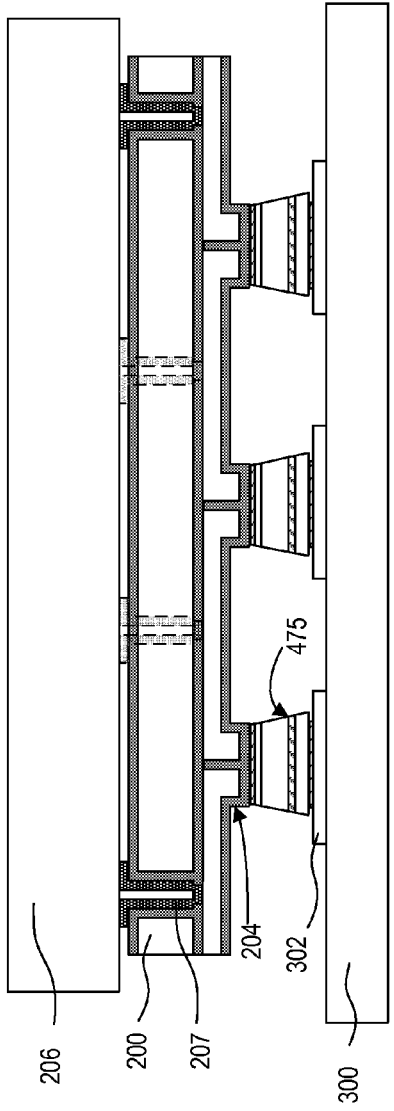
FIG. 4C
FIG. 4D

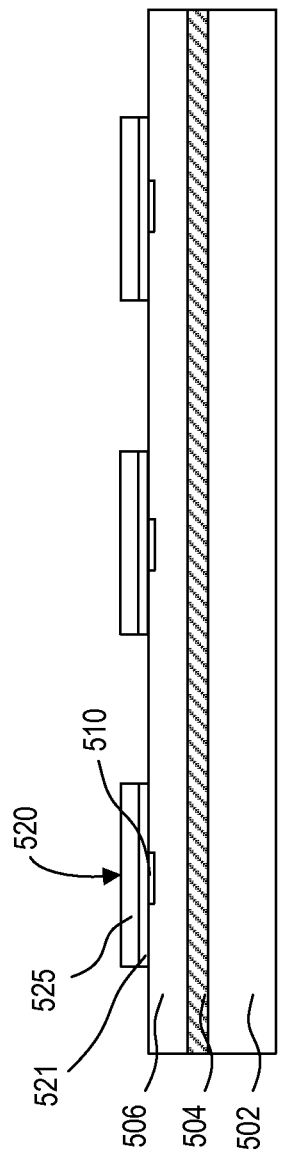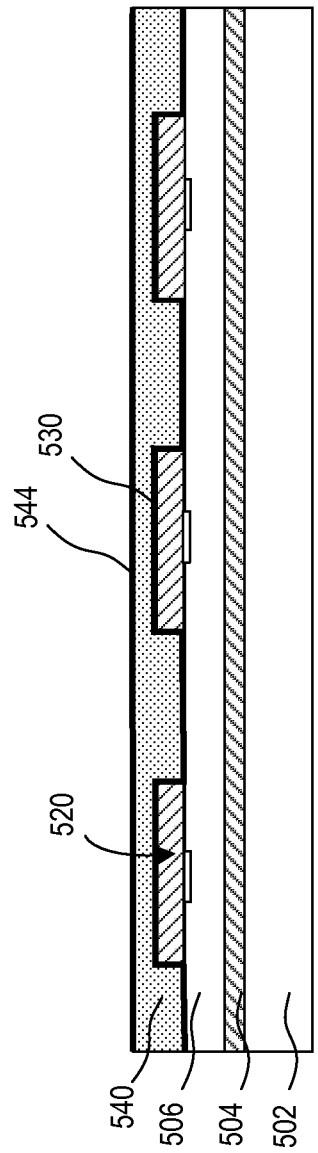

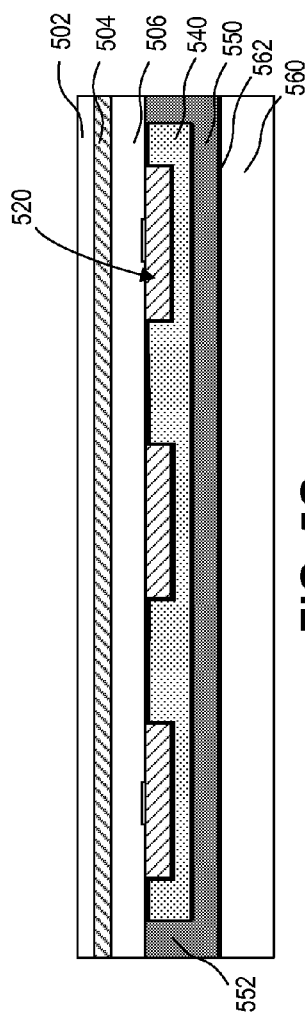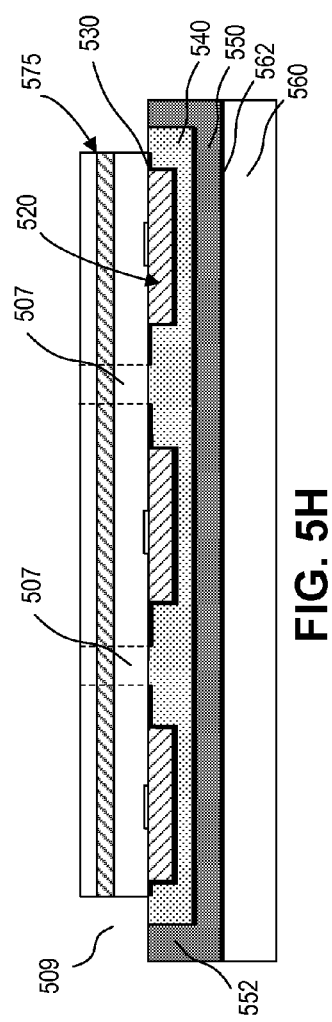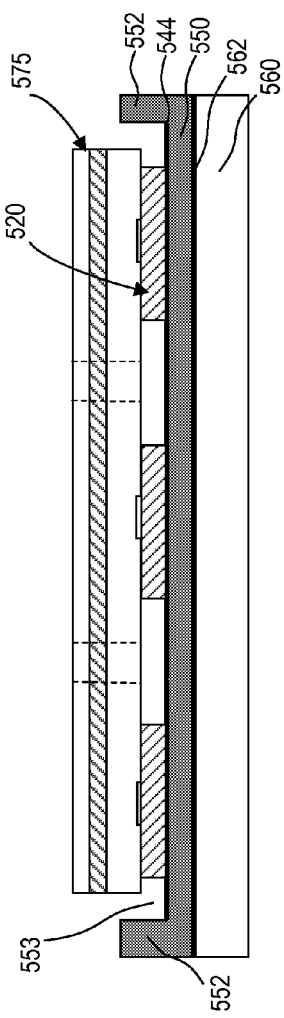

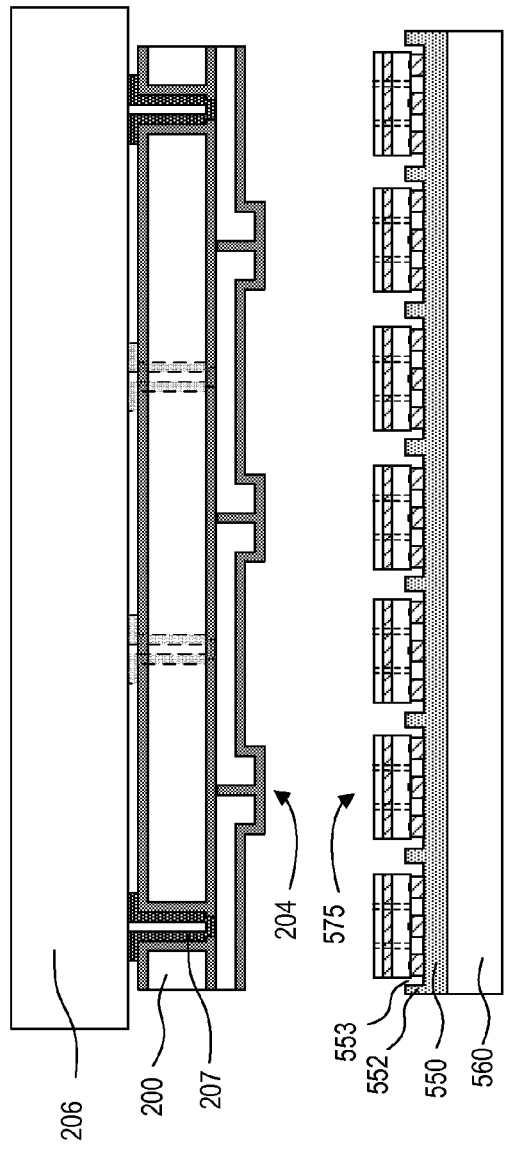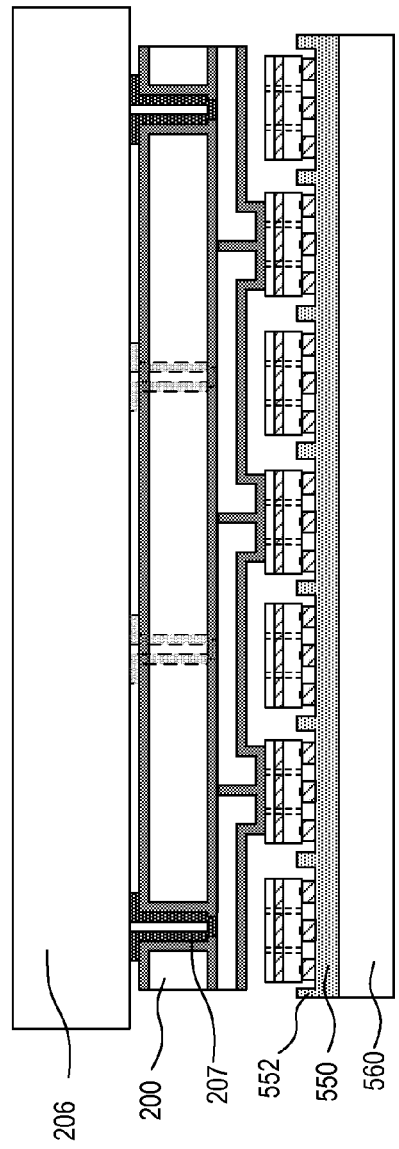
FIG. 6A
FIG. 6B

STABILIZATION STRUCTURE INCLUDING SACRIFICIAL RELEASE LAYER AND STAGING BOLLARDS

RELATED APPLICATIONS

This application claims the benefit of priority from U.S. Provisional Patent Application Ser. No. 61/735,957 filed on Dec. 11, 2012.

BACKGROUND

1. Field

The present invention relates to micro devices. More particularly embodiments of the present invention relate to the stabilization of micro devices on a carrier substrate.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

BRIEF DESCRIPTION OF THE DRAWINGS

FIGS. 3C-3I are cross-sectional side view illustrations for a method of fabricating an array of micro LED devices within an array of staging bollards in accordance with embodiments of the invention.

FIGS. 4A-4E are cross-sectional side view illustrations for a method of transferring an array of micro LED devices from a carrier substrate to a receiving substrate in accordance with embodiments of the invention.

FIGS. 5A-5I are cross-sectional side view illustrations for a method of fabricating an array of micro chips within an array of staging bollards in accordance with embodiments of the invention.

FIGS. 6A-6E are cross-sectional side view illustrations for a method of transferring an array of micro chips from a carrier substrate to a receiving substrate in accordance with embodiments of the invention.

DETAILED DESCRIPTION OF THE INVENTION

Figure 1A:
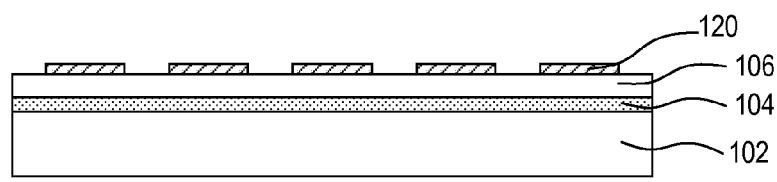
FIG. 1A is a cross-sectional side view illustration of an array of conductive contacts over a device layer in accordance with an embodiment of the invention.

Embodiments of the present invention describe a method and structure for stabilizing an array of micro devices such as micro light emitting diode (LED) devices and micro chips on a carrier substrate so that they are poised for pick up and transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments some of the present invention are described with specific regard to micro LED devices comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser). Other embodiments of the present invention are described with specific regard to micro chips including circuitry. For example, the micro chips may be based on silicon or SOI wafers for logic or memory applications, or based on GaAs wafers for RF communications applications.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "spanning", "to", "between", and "on" as used herein may refer to a relative position of one layer with respect to other layers. One layer "over", "spanning", or "on" another layer or bonded "to" another layer may be directly in contact with the other layer or may have one or more intervening layers. One layer "between" layers may be directly in contact with the layers or may have one or more intervening layers.

The terms "micro" device, "micro" chip, or "micro" LED device as used herein may refer to the descriptive size of certain devices, chips, or structures in accordance with embodiments of the invention. As used herein the term "micro device" specifically includes, but is not limited to, "micro LED device" and "micro chip". As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 μm. In an embodiment, the top contact surface of each micro device or electrostatic transfer head has a maximum dimension of 1 to 100 μm, or more specifically 3 to 20 μm. In an embodiment, a pitch of an array of micro devices, and a corresponding array of electrostatic transfer heads is (1 to 100 μm) by (1 to 100 μm), for example a 20 μm by 20 μm pitch or 5 μm by 5 μm pitch.

In one aspect, embodiments of the invention describe a structure for stabilizing an array of micro devices on a carrier substrate so that they are poised for pick up and transfer to a receiving substrate. In an embodiment, an array of micro devices are held within a corresponding array of staging cavities in which each micro device is laterally retained between a plurality of staging bollards. In an embodiment, each micro device is embedded in a sacrificial release layer within the array of staging cavities. When the array of micro devices are embedded within the sacrificial release layer the structure may be durable for handling and cleaning operations to prepare the structure for subsequent sacrificial release layer removal and electrostatic pick up.

In another aspect, embodiments of the invention describe a stabilization structure which allows for an array of micro devices to be closely spaced together. In an embodiment, a bollard is placed at an intersection, near a shared corner between an array of micro devices. In this manner, the array of bollards can surround a micro device, and a single bollard can be used to stabilize multiple micro devices. Furthermore, because the bollards are arranged at the corners, this frees up space between adjacent micro devices, where the micro devices are separated by etching, the micro devices are laterally separated with an open space. This may allow for a higher micro device density in a given substrate, which can reduce overall material cost. In an embodiment the space/width ($S_{adj}$) between adjacent micro devices is less than a maximum width ($W_{max}$) of the bollards. In an embodiment, the space between adjacent micro devices is greater than a minimum width ($W_{min}$) of the bollards.

Without being limited to a particular theory, embodiments of the invention utilize transfer heads and head arrays which operate in accordance with principles of electrostatic grippers, using the attraction of opposite charges to pick up micro devices. In accordance with embodiments of the present invention, a pull-in voltage is applied to a transfer head in order to generate a grip pressure on a micro device and pick up the micro device.

Upon removal of the sacrificial release layer the array of micro devices may drop into the staging cavities due to removal of the sacrificial release layer below the array of micro devices. This may significantly reduce the adhesion of the array micro devices to the support structure. In accordance with embodiments of the invention, adhesion between the staging cavity and the micro device after removal of the sacrificial release layer is less than adhesion between the micro device and the sacrificial release layer. In an embodiment, covalent bonds between a deposited sacrificial release layer and micro device may be removed, for example, covalent bonds associated with chemical vapor deposition (CVD). Accordingly, removal of the sacrificial release layer may remove adhesive forces resulting from layer on layer deposition. Furthermore, the array of micro devices are laterally restrained within the array of staging cavities by the array of bollards after removal of the sacrificial release layer. In this manner, the array of micro devices are poised for pick up with lower required pick up pressure, and the array of bollards ensures proper spacing of the array of micro devices for pick up.

In another aspect, embodiments of the invention describe a manner of forming an array of micro devices which are poised for pick up in which conductive contact layers can be formed on top and bottom surfaces of the micro devices, and annealed to provide ohmic contacts. Where a conductive contact is formed on a top surface of a micro device, a stabilization layer forming the array of staging bollards may be constructed of a material which is capable of withstanding the associated deposition and annealing temperatures. For example, a conductive contact may require annealing at temperatures between 200° C. to 350° C. to form an ohmic contact with the micro device. In this manner, embodiments of the invention may be utilized to form arrays of micro LED devices based upon a variety of different semiconductor compositions for emitting various different visible wavelengths. For example, micro LED growth substrates including active devices layers formed of different materials for emitting different wavelengths (e.g. red, green, and blue wavelengths) can all be processed within the general sequence of operations of the embodiments.

In the following embodiments, the mass transfer of an array of pre-fabricated micro devices with an array of transfer heads is described. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro devices which are poised for pick up are described as having a 20 μm by 20 μm pitch, or 5 μm by 5 μm pitch. At these densities a 6 inch substrate, for example, can accommodate approximately 165 million micro devices with a 10 μm by 10 μm pitch, or approximately 660 million micro devices with a 5 μm by 5 μm pitch. A transfer tool including an array of transfer heads matching an integer multiple of the pitch of the corresponding array of micro devices can be used to pick up and transfer the array of micro devices to a receiving substrate. In this manner, it is possible to integrate and assemble micro devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

In the following description exemplary processing sequences are described for forming an array of micro devices within an array of staging cavities. Specifically, exemplary processing sequences are described for forming an array of micro LED devices and an array of micro chips. While the various sequences are illustrated and described separately, it is to be understood that the exemplary processing sequences share similar features and methods. Where possible, similar features are illustrated with similar annotations in the figures and following description.

FIG. 1A is a cross sectional side view illustration of a patterned conductive layer on a handle substrate in accordance with embodiments of the invention. Handle substrate 102 may be a variety of substrates, depending upon the particular micro device being formed. In an embodiment, where the micro devices being formed are micro LED devices, the handle substrate 102 may be a growth substrate suitable for the growth of an active device layer. In an embodiment, the handle substrate 102 is a sapphire substrate, silicon substrate, or SiC substrate for the growth of blue emitting or green emitting LED device. In an embodiment, the handle substrate 102 is a gallium arsenide (GaAs) substrate for the growth of red emitting LED devices. Cap layer 104 may optionally be formed between the device layer 106 and handle substrate 102. For example, the cap layer 104 may function as an etch stop layer to aid in subsequent removal of the handle substrate 102. Cap layer 104 may also be a bulk semiconductor layer used in the formation of the active device layer 106. Where the micro devices being formed are micro LED devices the active device layer 106 may include an n-doped layer, one or more quantum well layers, and a p-doped layer. Where the micro LED devices are designed to emit a red light (e.g. 620-750 nm wavelength) the device layer may include a material such as aluminum gallium arsenide (AlGaAs), gallium arsenide phosphide (GaAsP), aluminum gallium indium phosphide (AlGaInP), and gallium phosphide (GaP). Where the micro LED devices are designed to emit a green light (e.g. 495-570 nm wavelength) the device layer may include a material such as indium gallium nitride (InGaN), gallium nitride (GaN), gallium phosphide (GaP), aluminum gallium indium phosphide (AlGaInP), and aluminum gallium phosphide (AlGaP). Where the micro LED devices are designed to emit a blue light (e.g. 450-495 nm wavelength) the device layer may include a material such as gallium nitride (GaN), indium gallium nitride (InGaN), and zinc selenide (ZnSe).

In an embodiment, where the micro devices being formed are micro chips, the handle substrate 102 may be a semiconductor substrate such as a bulk silicon substrate. For example, the device layer 106, cap layer 104, and handle substrate 102 may be a silicon-on-insulator (SOI) substrate with the device layer 106 including device quality silicon, the cap layer 104 is a buried oxide layer, and the handle substrate 102 is a bulk silicon substrate.

In an embodiment, the cap layer 104 is 0.1-5 µm thick, and the device layer is 1-20 µm thick. A conductive contact layer may be formed over the device layer 106 using a suitable technique such as sputtering or electron beam deposition followed by etching or liftoff to form the array of conductive contacts 120. In an embodiment, the array of conductive contacts have a thickness of approximately 0.1-2 µm, and may include a plurality of different layers. A bonding layer may form the outermost surface of a conductive contact 120, and may be formed from a variety of materials for bonding to a receiving substrate, in an embodiment.

Figure 1B:
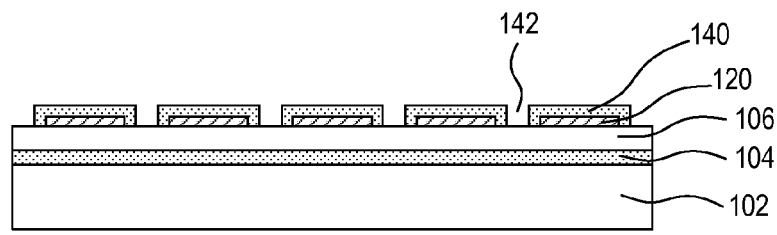
FIG. 1B is a cross-sectional side view illustration of a patterned sacrificial release layer with a plurality of bollard openings in accordance with an embodiment of the invention.

Referring now to FIG. 1B, a sacrificial release layer 140 is then deposited over the array of conductive contacts 120 and laterally between the conductive contacts. The thickness of the sacrificial release layer 140 may determine the amount that each micro device drops into a staging cavity when removed. In an embodiment, the sacrificial release layer 140 is 0.5-2 µm thick. The thickness of the sacrificial release layer 140 may also at least partially determine the height of the openings 142, which will become the stabilization structure sidewalls 152. In an embodiment, the sacrificial release layer 140 is not used to make electrical contact with the array of micro devices and is formed of an electrically insulating material. In an embodiment, the sacrificial release layer 140 is formed of a material which can be readily and selectively removed with vapor (e.g. vapor HF) or plasma etching. For example, the sacrificial release layer 140 may be an oxide (e.g. $SiO_2$) or nitride (e.g. $SiN_x$), though other materials can be used. In an embodiment, the sacrificial release layer is deposited by sputtering, low temperature plasma enhanced chemical vapor deposition (PECVD), or electron beam evaporation to create a low quality layer which may be more easily removed than a higher quality layer. The sacrificial release layer 140 may also be deposited to be porous so that it may be more quickly etched.

Figure 1C:
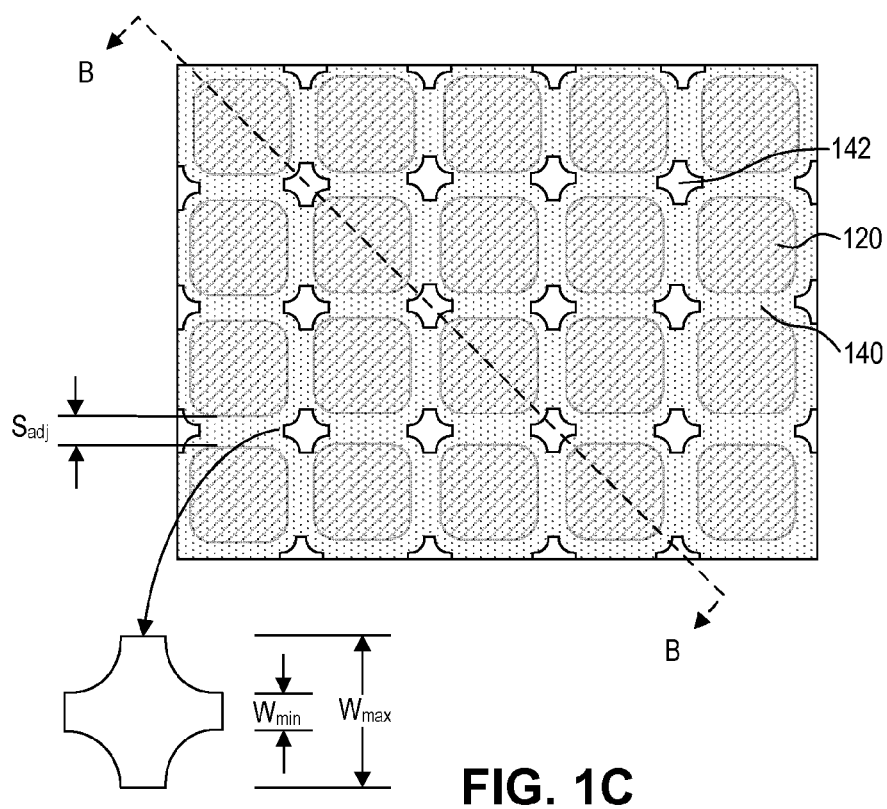
FIG. 1C is a top view illustration of FIG. 1B in accordance with an embodiment of the invention.
Figure 1D:
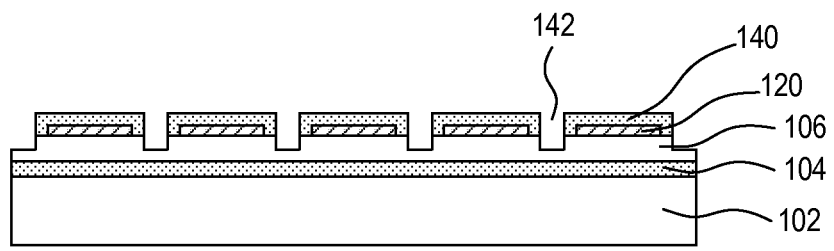
FIG. 1D is a cross sectional side vie illustration of a patterned device layer with a plurality of bollard openings in accordance with an embodiment of the invention.

As illustrated, the sacrificial release layer 140 is patterned to form an array of openings 142 between the array of conductive contacts 120, or more specifically between adjacent corners of adjacent conductive contacts, in accordance with an embodiment of the invention. As will become more apparent in the following description the height, and length and width of the openings 142 in the sacrificial release layer 140 correspond to the size of the stabilization bollards to be formed. In addition, the shape of the openings 142 may be made to increase micro device density. In an embodiment, the openings are diamond shaped. In the embodiment illustrated, the openings are diamond with concave sidewalls. The openings 142 may be shaped and sized to that the stabilization material can be deposited within the openings, for example, the viscosity of BCB should allow the BCB material to flow into the openings and assume the requisite shape. In an embodiment, openings 142 are formed using lithographic techniques and have a maximum length and maximum width (Wmax) of approximately 0.5-2 µm by 0.5-2 µm, though the openings may be larger or smaller. FIG. 1C is a top view illustration of FIG. 1B in accordance with an embodiment of the invention, with the cross-sectional side view illustration of FIG. 1B taken along line B-B of FIG. 1C. As will become apparent in the following description, adjacent micro devices can be closer together with smaller width openings 142, and consequently smaller width staging bollards 152. Referring to the embodiment illustrated in FIG. 1D, the openings 142 may be formed partially through the device layer 106, or even completely through device layer 106. In such an embodiment, this may allow for taller staging bollards 152 to be formed.

Figure 1E:
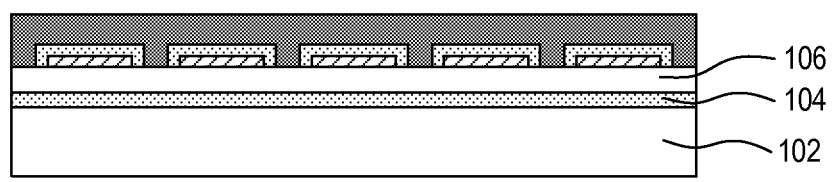
FIG. 1E is a cross-sectional side view illustration of a stabilization layer formed over and within openings in a patterned sacrificial release layer in accordance with an embodiment of the invention.

Referring now to FIG. 1E, a stabilization layer 150 is formed over the sacrificial release layer 140 that is over the array of conductive contacts 120 and laterally between the conductive contacts. In accordance with embodiments of the invention, a stabilization layer 150 formed of an adhesive bonding material. In accordance with some embodiments, the adhesive bonding material is a thermosetting material such as benzocyclobutene (BCB) or epoxy. In an embodiment, the thermosetting material may be associated with 10% or less volume shrinkage during curing, or more particularly about 6% or less volume shrinkage during curing so as to not delaminate from the underlying structure. In order to increase adhesion to the underlying structure the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 150 over the sacrificial release layer 140.

In an embodiment, stabilization layer 150 is spin coated or spray coated over the sacrificial release layer 140 and within openings 142, though other application techniques may be used. Following application of the stabilization layer 150, the stabilization layer may be pre-baked to remove the solvents. In an embodiment, the stabilization layer 150 is thicker than the height of openings 142 between the array of micro devices 175. In this manner, the thickness of the stabilization layer filling the openings 142 will become the stabilization structure sidewalls 152, and the remainder of the thickness of the stabilization layer 150 over the filled openings 142 can function to adhesively bond the handle substrate 102 a carrier substrate.

Figure 1F:
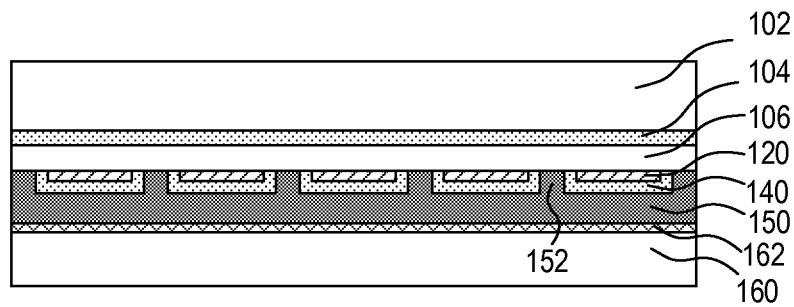
FIG. 1F is a cross-section side view illustration of a handle substrate bonded with a carrier substrate in accordance with an embodiment of the invention.

Referring now to FIG. 1F, a carrier substrate 160 such as silicon is bonded with the handle substrate 102 using the stabilization layer 150. In an embodiment, carrier substrate 160 is treated with an adhesion promoter layer 162 such as AP3000 described above. In an embodiment, stabilization layer 150 is cured at a temperature or temperature profile ranging between 150° C. and 300° C. Where stabilization layer 150 is formed of BCB, curing temperatures should not exceed approximately 350° C., which represents the temperature at which BCB begins to degrade. Depending upon the particular material selected, stabilization layer may be thermally cured, or cured with application of UV energy. Achieving a 100% full cure of the stabilization layer is not required in accordance with embodiments of the invention. More specifically, the stabilization layer 150 may be cured to a sufficient curing percentage (e.g. 70% or greater for BCB) at which point the stabilization layer 150 will no longer reflow. Partially cured (e.g. 70% or greater) BCB stabilization layer may possess sufficient adhesion strengths with the carrier substrate 102 and sacrificial release layer 140.

As described above, in an embodiment stabilization layer 150 may be formed from a spin-on electrical insulator material. In such an embodiment, planarization and bonding can be accomplished in the same operation without requiring additional processing such as grinding or polishing. In accordance with another embodiment, the stabilization layer 150 can be formed over the sacrificial layer 140 and within openings 142 using a molding technique such as injection molding. In such an embodiment, the stabilization layer 150 may be fully cured during injection molding. The stabilization layer 150 may also be substantially thick so as to function as a carrier substrate and bonding to a carrier substrate is not required.

Figure 1G:
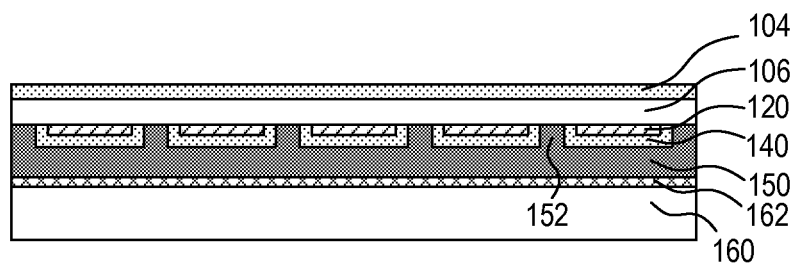
FIG. 1G is a cross-sectional side view illustration of a handle substrate removed from a carrier substrate in accordance with an embodiment of the invention.
Figure 1H:
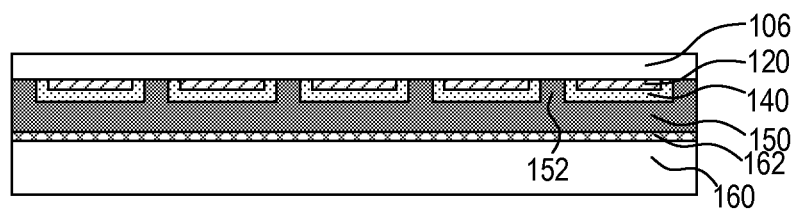
FIG. 1H is a cross-sectional side view illustration of a cap layer removed from a carrier substrate in accordance with an embodiment of the invention.

Referring now to FIGS. 1G-1H, the handle wafer 102 is removed. This may be accomplished using a variety of techniques depending upon the materials selection, including laser lift off (LLO), grinding, and etching. For example, as illustrated in FIG. 1G, the handle wafer 102 is thinned down by grinding, followed by etching. Where cap layer 104 is an etch stop layer, etching may stop on the etch stop layer. In an embodiment where the array of micro devices 175 are red-emitting LED devices, cap layer may be an etch stop layer, such as InGaP. In an embodiment where the array of micro devices are micro chips, cap layer may be a buried oxide layer. In an embodiment, where the array of micro devices 175 are blue-emitting or green-emitting LED devices, cap layer may be a GaN buffer layer. In an embodiment where cap layer 104 is a buffer layer, etching may be stopped using a timed etch. The cap layer 104, if present, is then removed as shown in FIG. 1H exposing the device layer 106. In an embodiment, the device layer 106 be thinned down at this stage to a reduced thickness. For example, where the original device layer 106 is too thick, or includes a buffer layer, additional thinning may be performed.

Figure 1I:
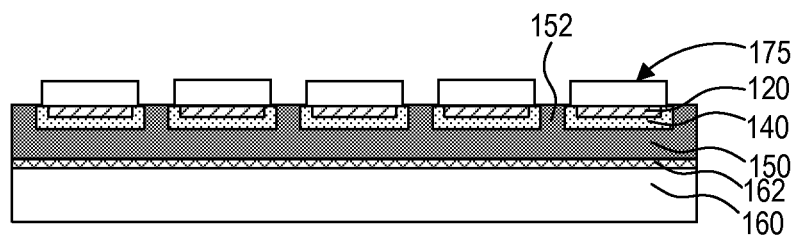
FIG. 1I is a cross-sectional side view illustration of an array of micro devices held with a stabilization structure on a carrier substrate in accordance with an embodiment of the invention.

Referring now to FIG. 1I, the device layer 106 is patterned to form an array of laterally separate micro devices 175. The particular etching technique and chemistry may be selected for the particular materials. For example, dry etching techniques such as reactive ion etching (RIE), electro-cyclotron resonance (ECR), inductively coupled plasma reactive ion etching ICP-RIE, and chemically assisted ion-beam etching (CAIBE) may be used. The etching chemistries may be halogen based, containing species such as $Cl_2$, $BCl_3$, or $SiCl_4$.

In the embodiment illustrated in FIG. 1I, at least the conductive contact 120 of each micro device 175 is embedded in the sacrificial release layer 140 within a staging cavity and is laterally retained between a plurality of staging bollards. For example, in the embodiment illustrated in FIG. 1I, the top surface of a conductive contact 120 is coplanar with a top surface of the surrounding staging bollards 152. In such an embodiment, the structure may be durable for handling and cleaning operations to prepare the structure for subsequent sacrificial release layer removal and electrostatic pick up. In embodiments where openings 142 are formed partially or wholly through the device layer 106, the device layer 106 is also embedded in the sacrificial release layer 140. For example, the top surface of a plurality of surrounding staging bollards 152 may rise above the bottom surface of the active device layer 106 of a corresponding micro device 175.

Figure 1J:
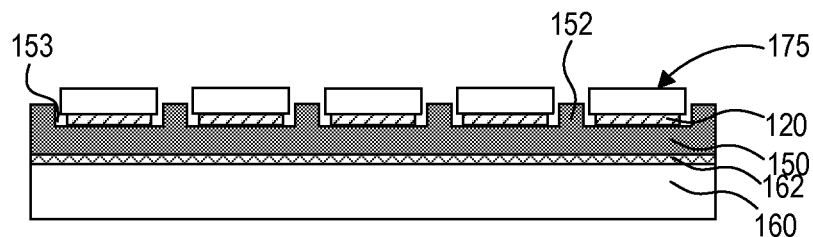
FIG. 1J is a cross-sectional side view illustration of a sacrificial release layer removed from a stabilization structure in accordance with an embodiment of the invention.

Referring now to FIG. 1J, the sacrificial release layer 140 may be removed, resulting in the array of micro devices 175 dropping into the array of staging cavities 153, where each micro device is laterally retained between a plurality of staging bollards 152. In an embodiment, a suitable etching chemistry such as an HF vapor, or $CF_4$ or $SF_6$ plasma can be used to remove the sacrificial release layer 140. In the particular embodiment illustrated at least a portion of the thickness of the device layer 106 of the micro devices 175 is laterally retained between a plurality of staging bollards 152.

Figure 2:
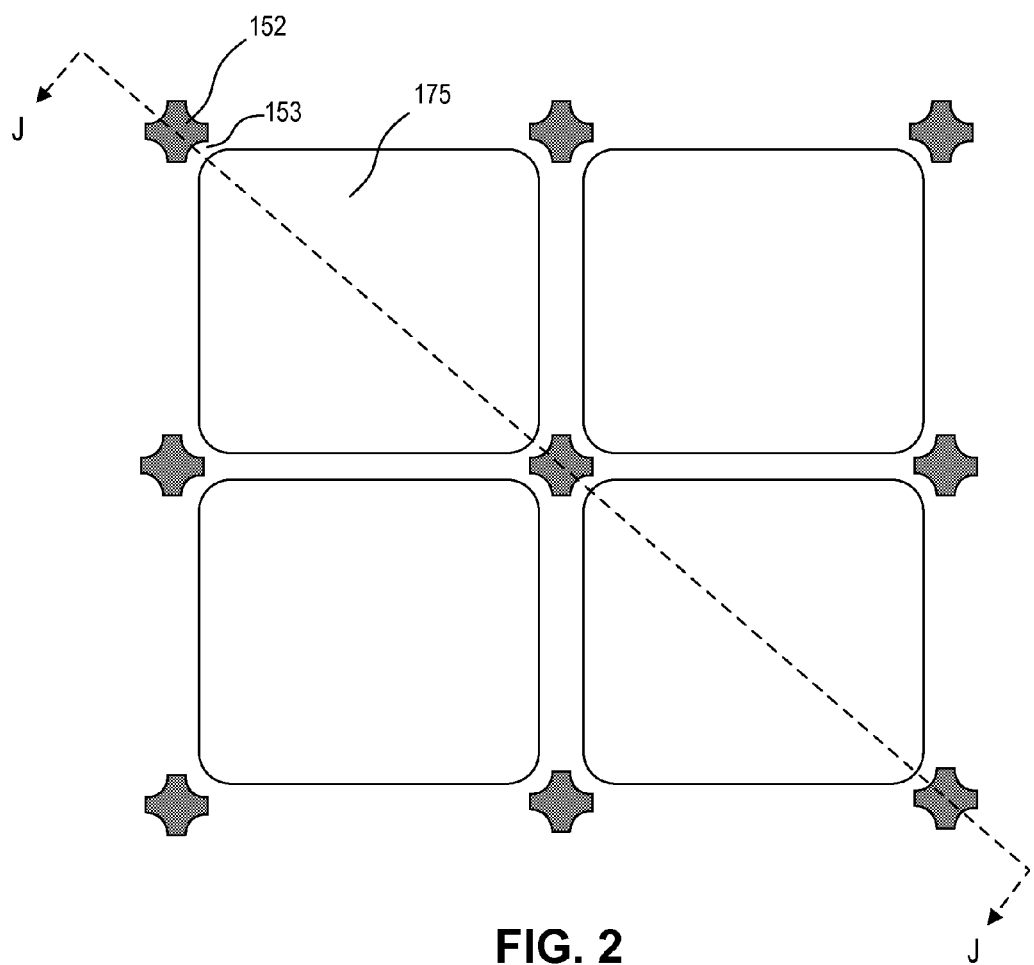
FIG. 2 is a top view illustration of an array of micro devices retained within an array of staging bollards after removal of a sacrificial release layer in accordance with an embodiment of the invention.

FIG. 2 is a top view illustration of an array of micro devices retained within an array of staging cavities after removal of a sacrificial release layer in accordance with an embodiment of the invention. In accordance with embodiments of the invention, the array of micro devices 175 are held within the corresponding array of staging cavities 153 in which each micro device laterally retained between a plurality of staging bollards 152. Each staging bollard 152 may be shared by a plurality of adjoining staging cavities 153. In an embodiment, each micro device has a maximum width of 1-100 μm. In an embodiment, each staging cavity has a maximum width of 1-100 μm. The staging cavities should be slightly larger than each micro device, the difference being determined by twice a thickness of the sacrificial release layer 140. More generally, a maximum width of each staging cavity is between 0.5 μm and 10 μm larger than the maximum width of a corresponding micro device within the staging cavity. In an embodiment, the staging bollards are between 0.5-20 μm wide, or 0.5 to 5 μm wide. In an embodiment, the staging bollards are between 0.5-2 μm wide in order to increase the micro device density on the carrier substrate. As illustrated, the array of micro devices 175 are laterally separated by free space, with the staging bollards at the street intersections preventing the released micro devices from moving laterally.

Figure 3A:
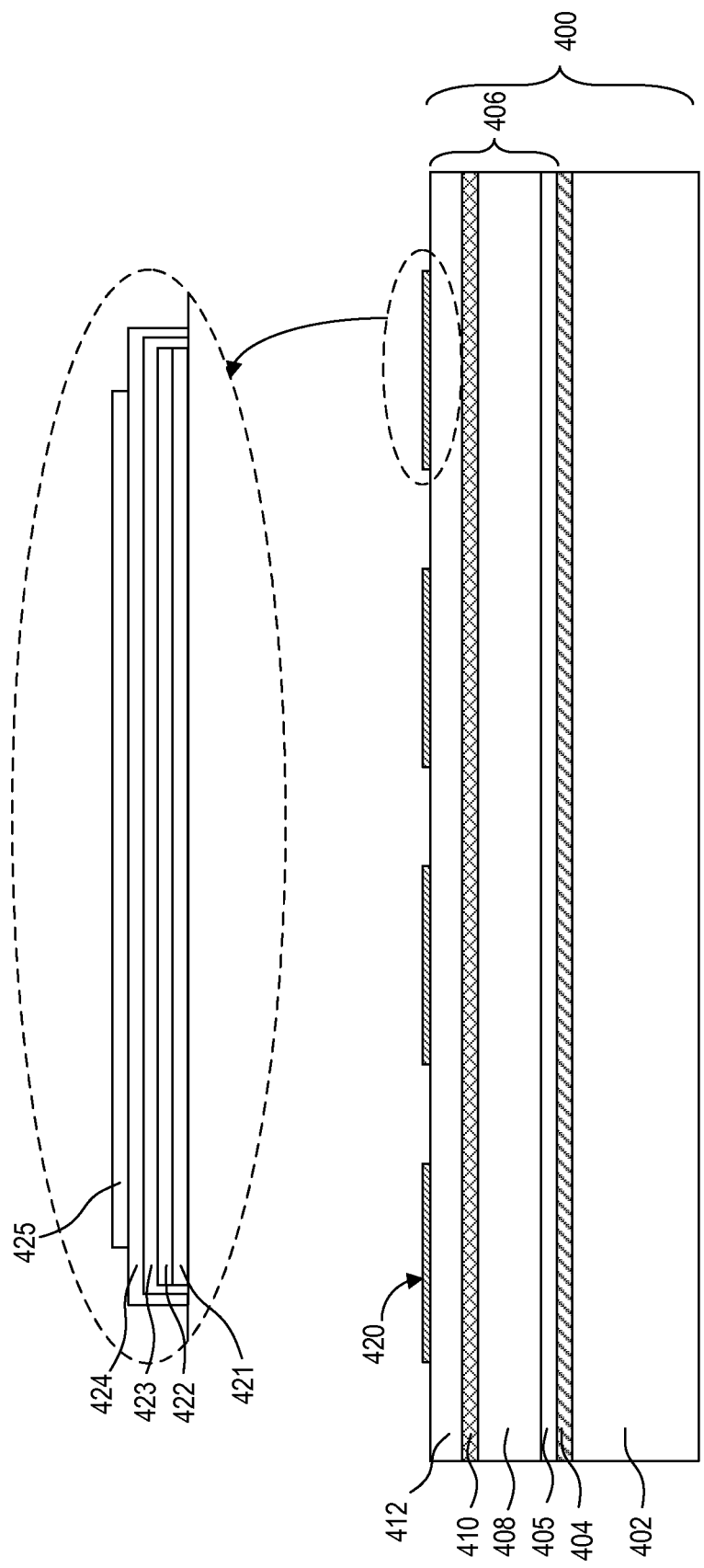
FIG. 3A is a cross-sectional side view illustration of a p-n diode layer formed over a handle substrate in accordance with an embodiment of the invention.
Figure 3B:
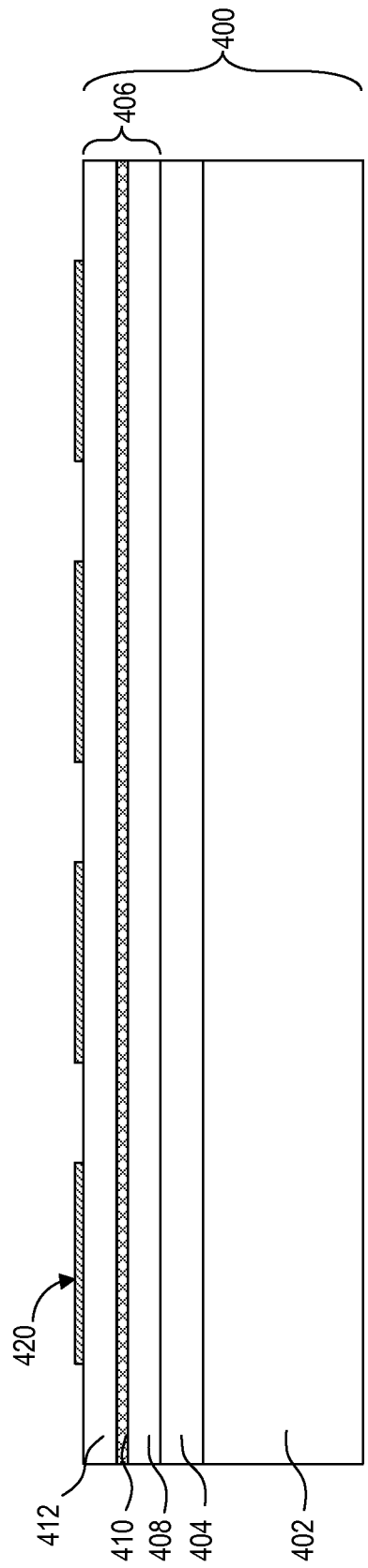
FIG. 3B is a cross-sectional side view illustration of a p-n diode layer formed over a handle substrate in accordance with an embodiment of the invention.

Referring now to FIGS. 3A-3B cross-sectional side view illustrations of different p-n diode layer configurations formed over a handle substrate are provided in accordance with an embodiment of the invention. In an embodiment, the structure illustrated in FIG. 3A is a red-emitting p-n diode structure 400. In an embodiment, substrate 402 is formed of GaAs, and is approximately 500 μm thick. The etch stop layer 404 may be formed of InGaP and approximately 2,000 angstroms thick. The ohmic layer 405 may be formed of GaAs and approximately 500 angstroms thick. In an embodiment, n-doped layer 408 is formed of AlGaInP, and is approximately 1 μm to 3 μm thick. The one or more quantum well layers 410 may have a thickness of approximately 0.5 μm. In an embodiment, p-doped layer 412 is formed of GaP, and is approximately 1 μm to 2 μm thick.

In an embodiment, the array of conductive contacts 420 have a thickness of approximately 0.1 μm-2 μm, and may include a plurality of different layers. For example, a conductive contact 420 may include an electrode layer 421 for ohmic contact, a minor layer 422, an adhesion/barrier layer 423, a diffusion barrier layer 424, and a bonding layer 425. In an embodiment, electrode layer 421 may make ohmic contact to the p-doped GaP layer 412, and may be formed of a high work-function metal such as nickel. In an embodiment, a minor layer 422 such as silver is formed over the electrode layer 421 to reflect the transmission of the visible wavelength. In an embodiment, titanium is used as an adhesion/barrier layer 423, and platinum is used as a diffusion barrier 424 to bonding layer 425. Bonding layer 425 may be formed of a variety of materials which can be chosen for bonding to the receiving substrate. Following the formation of layers 421-425, the substrate stack can be annealed to form an ohmic contact. For example, a p-side ohmic contact may be formed by annealing the substrate stack at 510° C. for 10 minutes.

In an embodiment, bonding layer 425 is formed of a conductive material (both pure metals and alloys) which can diffuse with a metal forming a contact pad on a receiving substrate (e.g. silver, gold, indium, bismuth, tin contact pad). Where bonding layer 125 has a liquidus temperature below the annealing temperature for forming the p-side ohmic contact, the bonding layer may be formed after annealing.

In an embodiment, the structure illustrated in FIG. 3B is a blue-emitting p-n diode structure 400. In such an embodiment, handle wafer 402 may be sapphire or SiC, and device layer 406 is formed of GaN. In an embodiment, a buffer GaN layer 404 is grown over the handle wafer 402, and device layer 406 includes an n-doped GaN layer 408, one or more quantum wells 410, and a p-doped GaN layer 412. In an embodiment, the handle wafer 402 is approximately 200 μm thick, the buffer GaN layer 404 is 5 μm thick, n-doped layer 408 is 0.1-3 μm thick, quantum well layer 410 is less than 0.3 μm thick, and the p-doped ayer 412 is approximately 0.1-6 μm thick. The array of conductive contacts 420 may be formed similarly as described with regard to FIG. 3A. In an embodiment, a different arrangement of materials for electrode layer 421 and/or mirror layer 422 may be used.

FIGS. 3C-3I are cross-sectional side view illustrations for a method of fabricating an array of micro LED devices within an array of staging cavities and laterally retained between a plurality of staging bollards in accordance with embodiments of the invention. Referring now to FIG. 3C a sacrificial release layer 440 is formed over the bulk LED substrate 400 and array of conductive contacts 420 in accordance with an embodiment of the invention. In an embodiment, sacrificial release layer 440 is between approximately 0.5 and 2 microns thick. In an embodiment, the sacrificial release layer 440 is not used to make electrical contact with the array of micro LED devices and is formed of an electrically insulating material. The sacrificial release layer 440 may also be formed of a material which can be readily and selectively removed with vapor (e.g. vapor HF) or plasma etching. For example, sacrificial release layer may be formed of an oxide (e.g. $SiO_2$) or nitride (e.g. $SiN_x$), though other materials may be used which can be selectively removed with respect to the other layers. In an embodiment, sacrificial release layer 440 is deposited by sputtering, low temperature plasma enhanced chemical vapor deposition (PECVD), or electron beam evaporation to create a low quality layer, which may be more easily removed than a higher quality layer deposited by other methods such as atomic layer deposition (ALD) or high temperature PECVD.

Still referring to FIG. 3C, prior to the formation of sacrificial release layer 440, barrier layer 430 may be formed. In an embodiment, barrier layer 430 is titanium. Barrier layer 430 may be formed by a variety of techniques such as sputtering or electron beam evaporation, and have a suitable thickness for visual observation during etching, for example, 100-300 angstroms. In an embodiment, barrier layer 430 prevents the diffusion of the layers in the array of conductive contacts 420 into the sacrificial release layer 440. For example, where there conductive contacts 420 are not already surrounded by a diffusion barrier layer, or include a bonding layer 425, the barrier layer 430 may prevent diffusion of certain materials from the conductive contacts into the sacrificial release layer 440. In one embodiment, barrier layer 430 prevents diffusion of a bonding layer 425 material into the surrounding sacrificial release layer 440. It has been observed that during the removal processes of sacrificial release layer 440 described in further detail below that inclusion of a barrier layer 430 may result in less residuals and shorter etching times, compared to embodiments which do not include a barrier layer 430. It is believed that this result may be attributed the prevention of diffusion of the bonding layer 425 material into the sacrificial release layer 440.

After the formation of sacrificial release layer 440, an adhesion promoter layer 444 may be formed in order to increase adhesion of the stabilization layer 450 (not yet formed) to the sacrificial release layer 440. Increase of adhesion between the sacrificial release layer 440 and the stabilization layer 450 may prevent delamination between the layers due to the stress of the device layer resulting from heterogeneous epitaxial growth of device layer. A thickness of 100-300 angstroms may be sufficient to increase adhesion. Specific metals that have good adhesion to both the sacrificial release layer 440 and a BCB stabilization layer include, but are not limited to, titanium and chromium. For example, sputtered or evaporated titanium or chromium can achieve an adhesion strength (stud pull) of greater than 40 MPa with BCB.

Still referring to FIG. 3C, the sacrificial release layer 440 is patterned to form an array of openings 442 between the array of conductive contacts 420 in accordance with an embodiment of the invention. If adhesion layer 444, and/or barrier layer 430 are present these layers may also be patterned to form the array of openings 442 through layers 444, 440, 430, exposing the device layer 406. In accordance with embodiments of the invention, a $SiO_2$ or $SiN_x$ sacrificial release layer 440 may be transparent, and endpoint etch detection cannot be easily determined with visual observation. Where a titanium etch stop detection layer 430 is present, a grayish color indicative of titanium can be visually observed during etching of the $SiO_2$ or $SiN_x$ sacrificial layer 440. The same etching chemistry (e.g. HF vapor, or $CF_4$ or $SF_6$ plasma) used to etch the $SiO_2$ or $SiN_x$ sacrificial release layer 440 also etches through the titanium barrier layer 430. Upon etching through layer 430, the grayish color associated with titanium disappears and the color of the underlying device layer 406 appears. In this manner, the barrier layer 430 allows for small bollard opening process inspection to ensure complete and uniform openings 442.

As will become more apparent in the following description the height, and length and width of the openings 442 in the sacrificial release layer 440 correspond to the height, and length and width (area) of the bollards to be formed. In an embodiment, openings 442 are formed using lithographic techniques and have a length and width of approximately 1 µm by 1 µm, though the openings may be larger or smaller.

In accordance with embodiments of the invention, a stabilization layer 450 formed of an adhesive bonding material is then formed over the patterned sacrificial layer 440, as illustrated in FIG. 3D. In accordance with some embodiments, the adhesive bonding material is a thermosetting material such as benzocyclobutene (BCB) or epoxy. In an embodiment, the thermosetting material may be associated with 10% or less volume shrinkage during curing, or more particularly about 6% or less volume shrinkage during curing so as to not delaminate from the underlying structure. In order to increase adhesion to the underlying structure, in addition to, or in alternative to adhesion promoter layer 444, the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 450 over the patterned sacrificial release layer 440.

In an embodiment, stabilization layer 450 is spin coated or spray coated over the patterned sacrificial release layer 440, though other application techniques may be used. Following application of the stabilization layer 450, the stabilization may be pre-baked to remove the solvents. In an embodiment, the stabilization layer 450 is thicker than the height of openings 442 in the patterned sacrificial release layer 440. In this manner, the thickness of the stabilization layer filling openings 442 will become stabilization bollards 452, and the remainder of the thickness of the stabilization layer 450 over the filled openings 442 can function to adhesively bond the bulk LED substrate 400 a carrier substrate.

As described above, in an embodiment stabilization layer 450 may be formed from a spin-on electrical insulator material. In such an embodiment, planarization and bonding can be accomplished in the same operation without requiring additional processing such as grinding or polishing. In accordance with another embodiment, the stabilization layer 450 can be formed over the patterned sacrificial release layer 440 using a molding technique such as injection molding. In such an embodiment, the stabilization layer 450 may be fully cured during injection molding. The stabilization layer 450 may also be substantially thick so as to function as a carrier substrate.

Figure 3E:
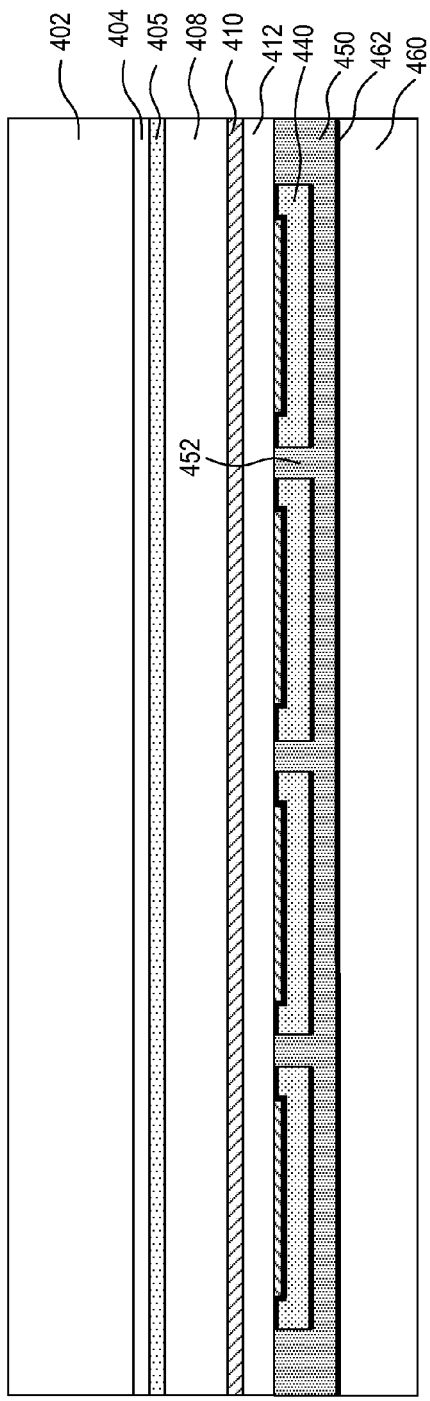

Referring now to the embodiment illustrated in FIG. 3E a handle substrate 402 is bonded to a carrier substrate 460 (such as silicon) with stabilization layer 450. Depending upon the particular material selected, stabilization layer 450 may be thermally cured, or cured with application of UV energy.

In order to increase adhesion with the stabilization layer 450 an adhesion promoter layer 462 can be applied to the carrier substrate 460 prior to bonding the handle substrate 402 to the carrier substrate 460 similarly as described above with regard to adhesion promoter layer 444. Likewise, in addition to, or in alternative to adhesion promoter layer 444, an adhesion promoter such as AP3000 may be applied to the surface of the carrier substrate 460 or adhesion promoter layer 462. In an embodiment, stabilization layer 450 is cured at a temperature or temperature profile ranging between 150° C. and 300° C. Where stabilization layer 450 is formed of BCB, curing temperatures should not exceed approximately 350° C., which represents the temperature at which BCB begins to degrade. Depending upon the particular material selected, stabilization layer may be thermally cured, or cured with application of UV energy. Achieving a 100% full cure of the stabilization layer is not required in accordance with embodiments of the invention. More specifically, the stabilization layer 450 may be cured to a sufficient curing percentage (e.g. 70% or greater for BCB) at which point the stabilization layer 450 will no longer reflow. Partially cured (e.g. 70% or greater) BCB stabilization layer may possess sufficient adhesion strengths with the carrier substrate 402 and sacrificial release layer 440. Where barrier layer 430 is present, the barrier layer 430 may prevent the diffusion of certain materials from the conductive contacts (e.g. bonding layer) into the sacrificial release layer 440 when curing the stabilization layer 450.

Figure 3F:
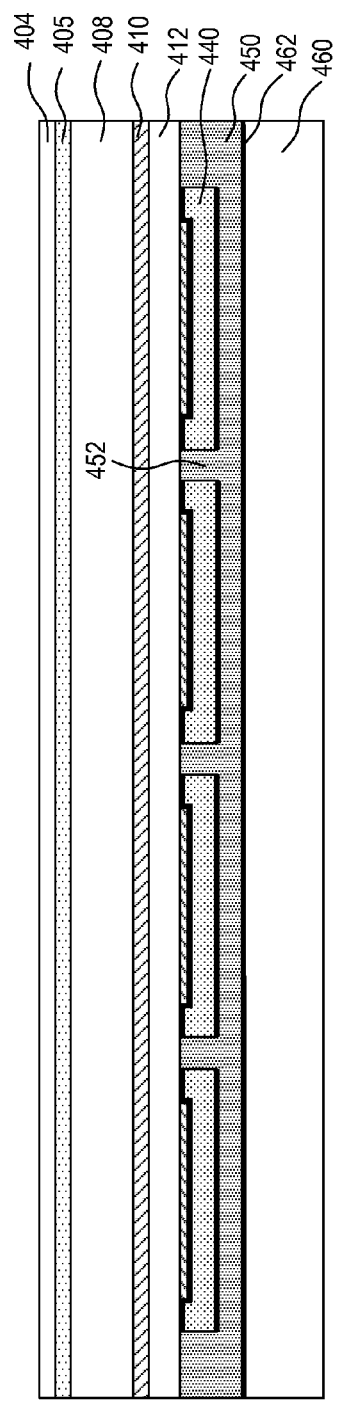

Referring now to FIG. 3F, removal of the growth substrate 402 is illustrated in accordance with an embodiment of the invention. Removal may be accomplished by a variety of methods including laser lift off (LLO), grinding, and etching depending upon the material selection of the growth substrate 402. In the particular embodiment illustrated where growth substrate 402 is formed of GaAs, removal may be accomplished by etching, or a combination of grinding and selective etching, with the selective etching stopping on an etch stop layer 404. For example, the GaAs growth substrate 402 can be removed with a $H_2SO_4+H_2O_2$ solution, $NH_4OH+H_2O_2$ solution, or $CH_3OH+Br_2$ chemistry, stopping on etch stop layer 404 formed of InGaP, for example. The etch stop layer 404 may then be removed to expose the ohmic layer 405. In an embodiment where etch stop layer is formed of InGaP, the etch stop layer may be removed by wet etching in a solution of $HCl+H_3PO_4$.

Figure 3G:
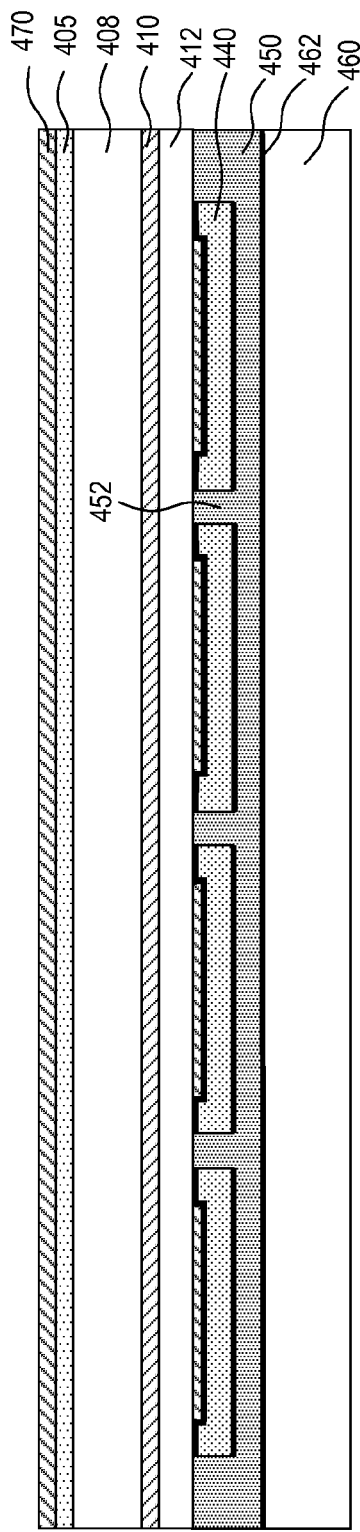

Referring now to the embodiments illustrated in FIG. 3G a conductive contact layer 470 is formed over the ohmic layer 405. In the particular embodiments illustrated conductive contact layer 470 is formed on ohmic layer 405. Conductive contact layer 470 may be formed of a variety of conductive materials including metals, conductive oxides, and conductive polymers. In an embodiment, conductive contact layer 470 is formed using a suitable technique such as sputtering or electron beam physical deposition. For example, conductive contact layer 470 may include BeAu metal alloy, or a metal stack of Au/GeAuNi/Au layers. Conductive contact layer 470 may also be indium-tin-oxide (ITO). Conductive contact layer can also be a combination of one or more metal layers and a conductive oxide. In an embodiment, after forming the conductive contact layer 470, the substrate stack is annealed to generate an ohmic contact between conductive contact layer 470 and ohmic layer 405. Where the stabilization layer is formed of BCB, the annealing temperature may be below approximately 350° C., at which point BCB degrades. In an embodiment, annealing is performed between 200° C. and 350° C., or more particularly at approximately 320° C. for approximately 10 minutes. In an embodiment, conductive contacts 470 have a thickness of 50 angstroms. Where conductive contacts are metal, the thickness may be thin for transparency reasons. In an embodiment where conductive contacts are formed of a transparent material such as ITO, the conductive contacts may be thicker, such as 1,000 to 2,000 angstroms. In an embodiment, barrier layer 430 may prevent the diffusion of the layers in the array of conductive contacts 420 into the sacrificial release layer 440 during annealing.

Figure 3H:
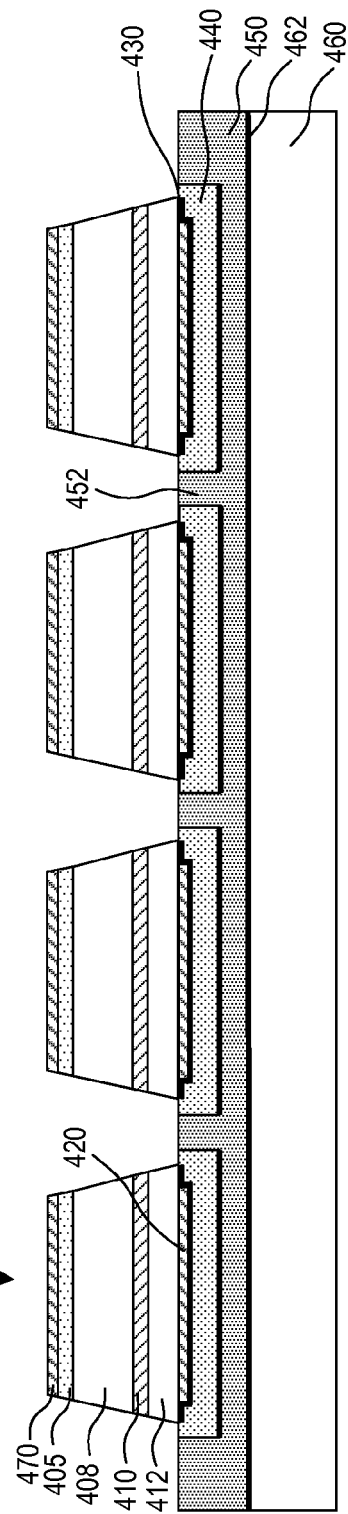

Referring now to FIG. 3H, the conductive contact layer 470 and device layers 405, 408, 410, 412 are patterned and etched to form an array of laterally separate micro LED devices 475. In the embodiment illustrated in FIG. 3H, at least the conductive contact 420 of each micro LED device 475 is embedded in the sacrificial release layer 440 within a staging cavity and is laterally retained between a plurality of staging bollards. For example, in the embodiment illustrated in FIG. 3H, the top surface of a conductive contact 420 is coplanar with a top surface of the surrounding staging bollards 452. At this point, the resultant structure still robust for handling and cleaning operations to prepare the substrate for subsequent sacrificial layer removal and electrostatic pick up. In embodiments where openings 442 are formed partially or wholly through the device layer 406, the device layer 406 is also embedded in the sacrificial release layer 440. For example, the top surface of a plurality of surrounding staging bollards 452 may rise above the bottom surface of the active device layer 406 of a corresponding micro LED device 475.

In an exemplary embodiment where the array of micro LED devices have a pitch of 5 microns, each micro device may have a minimum width (e.g. along the top surface of layer 170) of 4.5 µm, and a separation ($S_{adj}$) between adjacent micro devices of 0.5 µm. It is to be appreciated that a pitch of 5 microns is exemplary, and that embodiments of the invention encompass any pitch of 1 to 100 µm as well as larger, and possibly smaller pitches. Etching of layers 470, 405, 408, 410, and 412 may be accomplished using suitable etch chemistries for the particular materials. For example, AlGaInP n-doped layer 408, quantum well layer(s) 410a GaP, and p-doped layer 412 may be dry etched in one operation with a $CF_4$ or $SF_6$ chemistry stopping on the sacrificial release layer 440 and staging bollards 452.

Figure 3I:
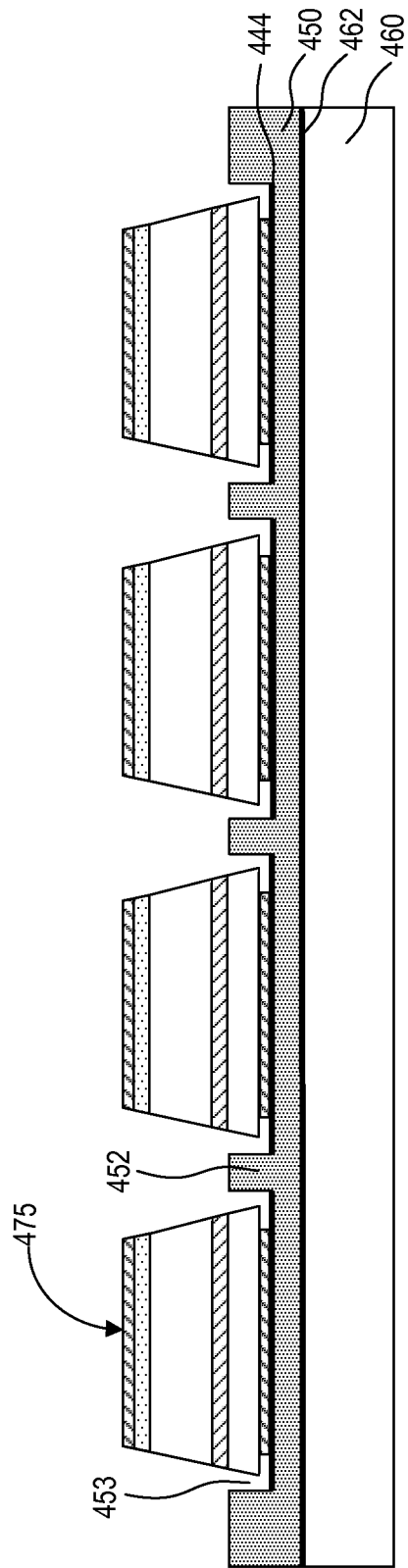

As illustrated in FIG. 3I, the sacrificial release layer 440 may be removed following the formation of laterally separate micro devices 475, resulting in the array of micro LED devices 475 dropping into the array of staging cavities 453, where each micro LED device is laterally retained between a plurality of staging bollards 452. In an embodiment, a suitable etching chemistry such as an HF vapor, or $CF_4$ or $SF_6$ plasma can be used to remove the sacrificial release layer 440. In the particular embodiment illustrated at least a portion of the thickness of the device layer 406 of the micro LED devices 475 is laterally retained between a plurality of staging bollards 452.

Figure 4E:
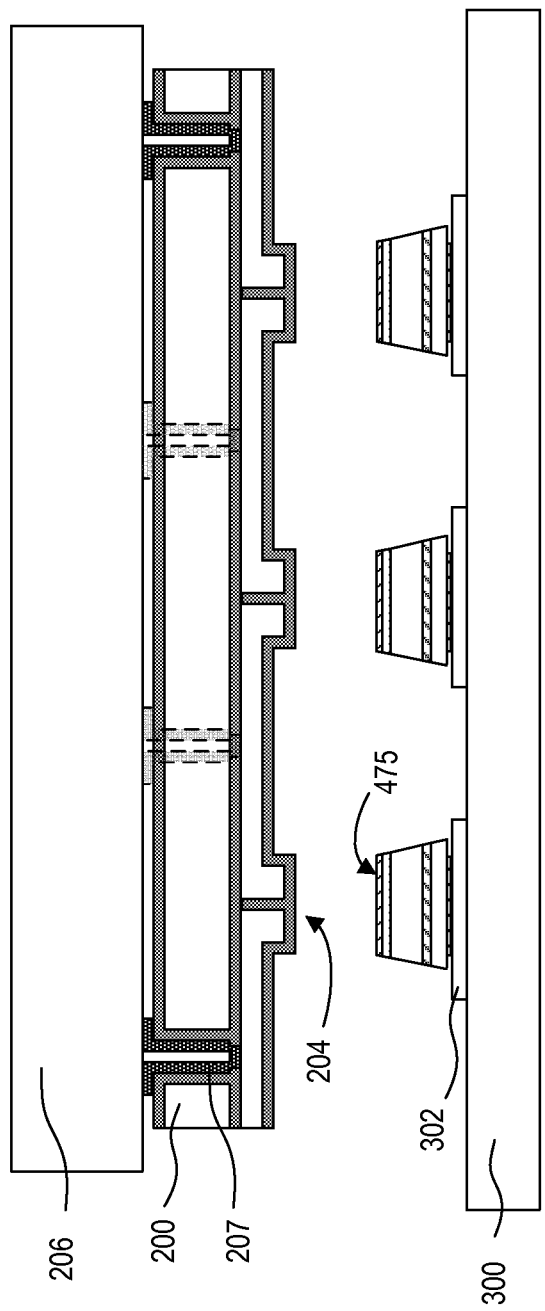

Following removal of the sacrificial release layer 440, the released array of micro devices is poised for pick up and transfer to a receiving substrate. FIGS. 4A-4E are cross-sectional side view illustrations for a method of transferring an array of micro LED devices from a carrier substrate to a receiving substrate in accordance with embodiments of the invention. FIG. 4A is a cross-sectional side view illustration of an array of micro device transfer heads 204 supported by substrate 200 and positioned over an array of micro LED devices 475 retained within a corresponding array of staging cavities 453 in accordance with an embodiment of the invention. The array of micro LED devices 475 are then contacted with the array of transfer heads 204 as illustrated in FIG. 4B.

As illustrated, the pitch of the array of transfer heads 204 is an integer multiple of the pitch of the array of micro LED devices 475. A voltage is applied to the array of transfer heads 204. The voltage may be applied from the working circuitry within a transfer head assembly 206 in electrical connection with the array of transfer heads through vias 207. The array of micro LED devices 475 is then picked up with the array of transfer heads 204 as illustrated in FIG. 4C. The array of micro LED devices 475 is then brought into contact with contact pads 302 (e.g. gold, indium, or tin) on receiving substrate 300 as illustrated in FIG. 4D. For example, the receiving substrate may be, but is not limited to, a display substrate, a lighting substrate, a substrate with functional devices such as transistors or ICs, or a substrate with metal redistribution lines.

In one embodiment, an operation is performed to diffuse a bonding layer connecting the array of micro devices 475 with the contact pads 302 while contacting the array of micro devices with the contact pads 302. For example, a silver, gold, indium, or tin bonding layer may be diffused with a silver, gold, indium, or tin contact pad 302, though other materials may be used. In an embodiment, sufficient diffusion to adhere the array of micro LED devices 475 with the array of contact pads 302 can be achieved at temperatures of less than 200° C. For example, heat can be applied from a heat source located within the transfer head assembly 206 and/or receiving substrate 300.

The operation of applying the voltage to create a grip pressure on the array of micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after creating a phase change in the bonding layer.

Where the transfer heads 204 include bipolar electrodes, an alternating voltage may be applied across a pair of electrodes in each transfer head 204 so that at a particular point in time when a negative voltage is applied to one electrode, a positive voltage is applied to the other electrode in the pair, and vice versa to create the pickup pressure. Releasing the array of micro devices from the transfer heads 204 may be further accomplished with a varied of methods including turning off the voltage sources, lower the voltage across the pair of silicon electrodes, changing a waveform of the AC voltage, and grounding the voltage sources.

Figure 5A:
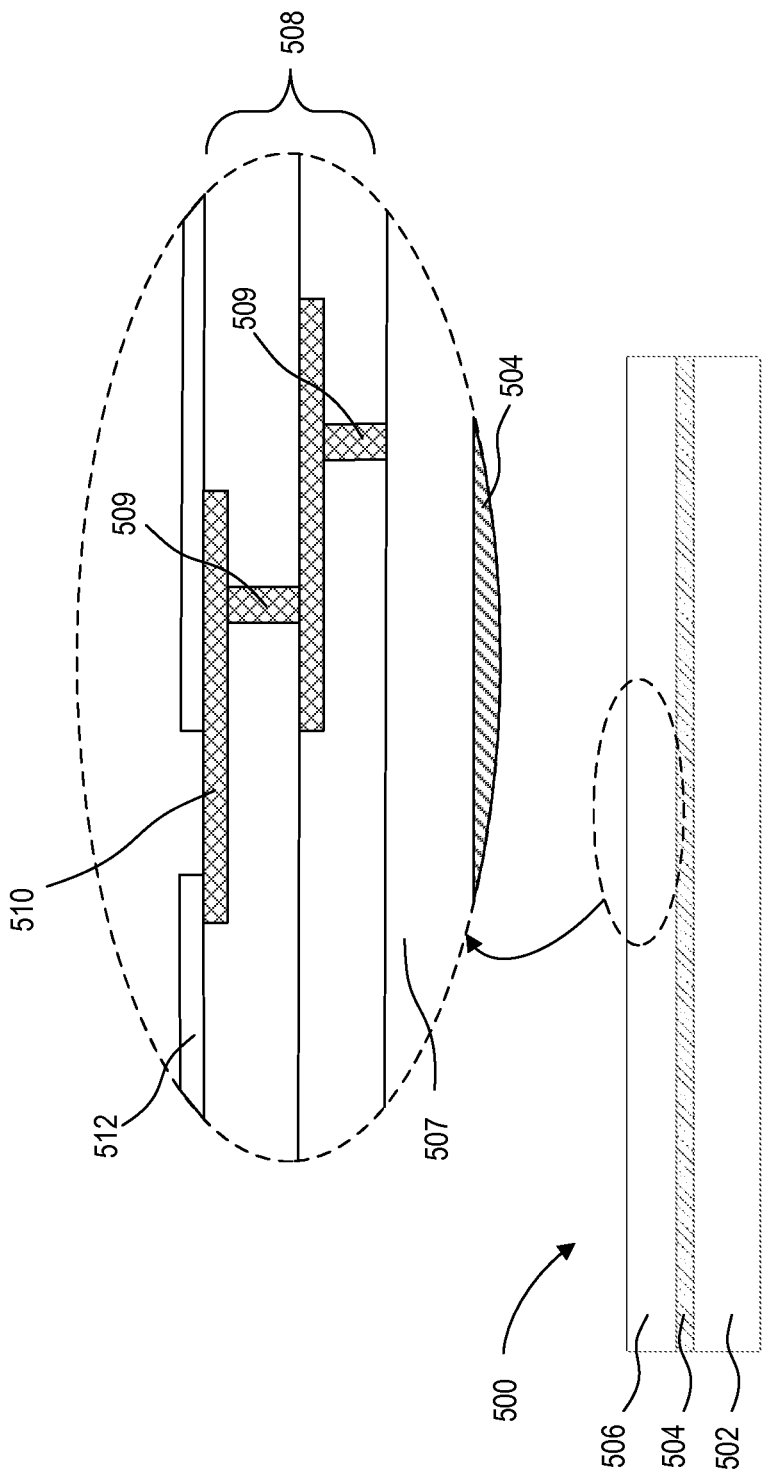

FIGS. 5A-5I are cross-sectional side view illustrations for a method of fabricating an array of micro chips within an array of staging cavities in accordance with embodiments of the invention. FIG. 5A is a cross-sectional side view illustration of a device wafer including circuitry in accordance with embodiments of the invention. In accordance with embodiments of the invention, the device wafer 500 may be formed of a variety of materials depending upon the desired function. For example, in an embodiment, the device wafer 500 is a silicon wafer, or silicon-on-insulator (SOI) wafer for logic or memory. In an embodiment, the device wafer 500 is a gallium arsenide (GaAs) wafer for radio frequency (RF) communications. These are merely examples, and embodiments of the invention envision are not limited to silicon or GaAs wafers, nor are embodiments limited to logic, memory, or RF communications.

In an embodiment, the device wafer 500 includes an active device layer 506, optional buried oxide layer 504, and handle substrate 502. In interest of clarity, the following description is made with regard to an SOI device wafer 500, including an active device layer 506, buried oxide layer 504, and silicon handle substrate 502, though other types of devices wafers may be used, including bulk semiconductor wafers. In an embodiment, the active device layer 506 may include working circuitry to control one or more LED devices when placed display or lighting substrate. In some embodiments, back-end processing may be performed within the active device layer. Accordingly, in an embodiment, the active device layer 506 includes an active silicon layer 507 including a device such as a transistor, metal build-up layers 508 including interconnects 509, bonding pads 510, and passivation 512.

Referring now to FIG. 5B, an array of conductive contacts 520 may be formed over the active device layer 506. The array of conductive contacts 520 may make contact with contact pads 510 formed in the active device layer 506 during back-end processing. In an embodiment, the conductive contacts 520 include a seed layer 521 such as a Ti/TiW/Ag or Ti/TiW/Cu stack, though other materials may be used. In an embodiment, the seed layer is less than 1 μm thick. A bonding layer 525 may also be included over the seed layer in the conductive contacts 520. Bonding layer may be formed of a variety of materials which can be chosen for bonding to the receiving substrate. The array of conductive contacts 520 may be formed similarly as described above for conductive contacts 120, 420.

In an embodiment, the bonding layer 525 is formed by plating. In such an embodiment, the seed layer 521 may be cleaned with a pre-plating hydrochloric acid (HCl) oxide strip, and a thin positive photoresist is patterned to form a plating area. In an embodiment, approximately 1-2 μm of bonding layer material, for example indium or gold, is plated. The resist is then stripped and the exposed portions of seed layer 521 are removed with wet etching, resulting in the formation of the array of conductive contacts 520.

Figure 5D:
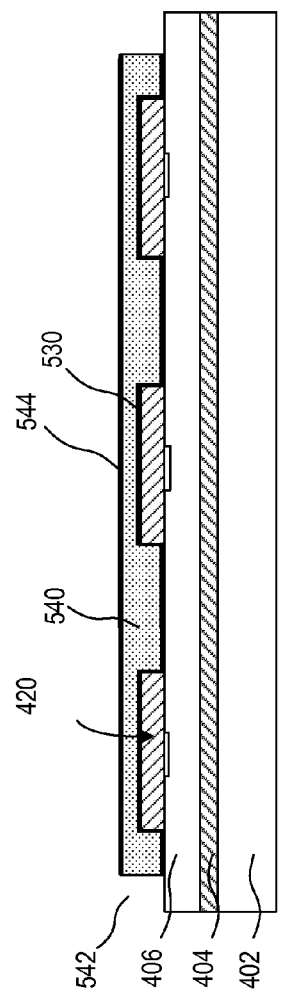

Referring now to FIG. 5C, a sacrificial release layer 540 is formed over the active device layer 506 and array of conductive contacts 520 in accordance with an embodiment of the invention. In an embodiment, sacrificial release layer 540 is between approximately 0.5 and 2 microns thick. In an embodiment, the sacrificial release layer 540 is not used to make electrical contact with the array of micro chips and is formed of an electrically insulating material. The sacrificial release layer 540 may also be formed of a material which can be readily and selectively removed with vapor (e.g. vapor HF) or plasma etching. For example, sacrificial release layer 540 may be formed of an oxide (e.g. $SiO_2$) or nitride (e.g. $SiN_x$), though other materials may be used which can be selectively removed with respect to the other layers. Sacrificial release layer 540 may be formed similarly as described above for sacrificial release layer 140, 440. Furthermore, one or both of etch stop detection/barrier layer 530 and adhesion promoter layers 544 may optionally be formed similarly as layers 430, 444 described above. Referring now to FIG. 5D, the sacrificial release layer 540, and optional layers 530, 544 are patterned to form an array of openings 542 between the array of conductive contacts, in accordance with an embodiment of the invention. As illustrated, a plurality of conductive contacts 420 are laterally between a pair of openings 542. Similarly as described above, layer 530 may function as an endpoint etch detection layer to ensure complete and uniform openings 542. As described above with regard to openings 142, 442, the height, and length and width of the openings 542 in the sacrificial release layer 540 corresponds to the height, and length and width (area) of the bollards 552 to be formed.

Figure 5E:
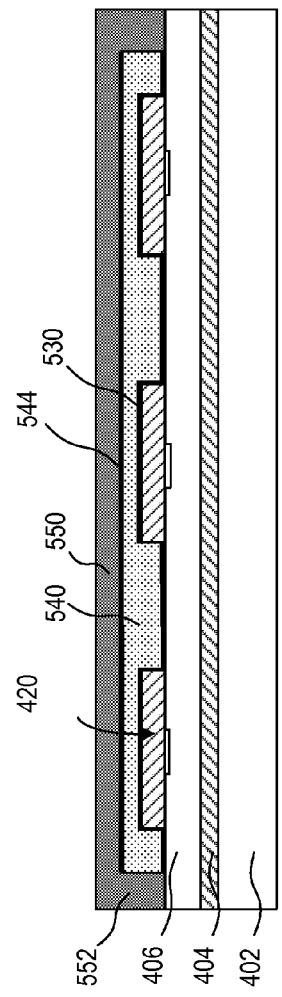

Following the formation of openings 542, a stabilization layer 550 is then formed over the patterned sacrificial release layer 540 as illustrated in FIG. 5E. Stabilization layer 550 may be formed similarly as stabilization layer 150, 450 described above. In an embodiment, stabilization layer 550 is formed from a thermosetting adhesive bonding material such s BCB or epoxy as described above.

Figure 5F:
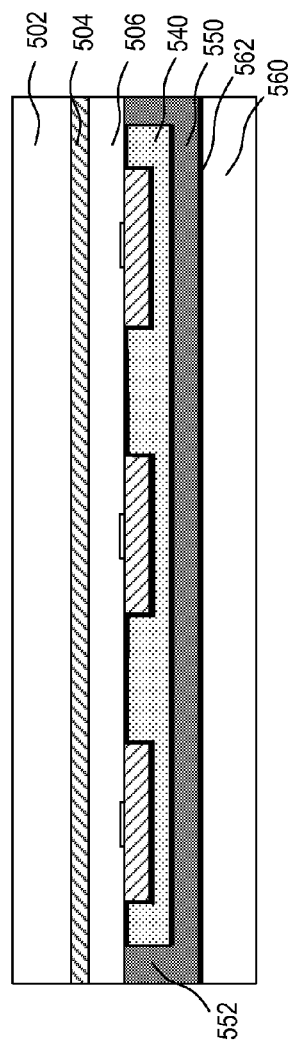

Referring now to FIG. 5F, the device wafer 500 is bonded to a carrier substrate 560 (such as silicon) with the stabilization layer 550. In the embodiment illustrated in FIG. 5E, the stabilization layer 550 is applied over the surface of the device wafer 500. Alternatively or additionally, the stabilization layer 550 may be applied over the surface of the carrier substrate 560. Similar to the previous discussion above, adhesion promoter layer 562 can be applied similarly as adhesion promoter layer 562. Depending upon the particular material selected, the stabilization layer 550 may then be cured as previously described for stabilization layer 550. Where stabilization layer 550 is formed of a thermoplastic material, or other adhesive, a thermal cure operation is not required.

Following bonding of the device wafer 500 to the carrier substrate 560, the device wafer may be thinned down. In the particular embodiment illustrated in FIG. 5G, the device wafer 500 is an SOI wafer. The base substrate 502 may be thinned using a variety of methods including grinding and etching depending upon the particular wafer. In an embodiment, the base substrate 502 is only partially removed through a combination of grinding and etching. In another embodiment, the base substrate 502 is completely removed through a combination of grinding and etching to the buried oxide layer 504. In another embodiment, the base substrate and buried oxide layer 504 are completely removed, stopping on the active device layer 506.

Referring now to FIG. 5H, the device wafer is patterned to form an array of laterally separate micro chips 575. Patterning may be performed by a variety of etching methods, stopping on the sacrificial layer 550 and staging bollards 552. In an embodiment, etching is performed using positive photoresist lithography, and DRIE to form openings 509 between the array of laterally separate micro chips 575. In an embodiment, one or more through holes 507 may also be formed through the micro chips 575.

If an etch stop detection layer 530 is present, the etching chemistry used for etching through the device wafer 500 may also remove the etch stop detection layer 530 exposed from openings 509, 507. In an embodiment, etch stop detection through the device wafer 500 may be visually detected with an optical microscope when etch stop detection layer 530 is present. Once the device wafer 500 is etched through the grayish color of a titanium etch stop detection layer 530 may flash across the wafer, providing an indication that etching through the device wafer 500 is complete. If the titanium etch stop detection layer 530 is etched through, the appearance of the underlying structure may be observed.

In the embodiment illustrated in FIG. 5H, at least the conductive contact 520 of each micro chip 575 is embedded in the sacrificial release layer 540 within a staging cavity and is laterally retained between a plurality of staging bollards. For example, in the embodiment illustrated in FIG. 5H, the top surfaces of the conductive contacts 520 are coplanar with the top surface of the surrounding staging bollards 552. At this point, the resultant structure is still robust for handling and cleaning operations to prepare the substrate for subsequent sacrificial layer removal and electrostatic pick up. In embodiments where openings 542 are formed partially or wholly through the device layer 506, the device layer 506 is also embedded in the sacrificial release layer 540. For example, the top surface of a plurality of surrounding staging bollards 552 may rise above the bottom surface of the active device layer 506 of a corresponding micro chip 575. In an exemplary embodiment the array of micro chips have maximum width of 100 µm and a pitch of 1 to 100 µm as well as larger, and possibly smaller pitches.

Following the formation of laterally separate micro chips 575, the sacrificial release layer 540 may be removed resulting in the array of micro chips 575 dropping into the array of staging cavities 553, where each micro chip is laterally retained between a plurality of staging bollards 552. In an embodiment, a suitable etching chemistry such as an HF vapor, or $CF_4$ or $SF_6$ plasma can be used to remove the sacrificial release layer 540, and also removes the titanium barrier layer 430 if present. Through holes 507 formed through the micro chip 575 may assist in achieving complete removal of the sacrificial layer 540, and provide multiple paths for the vapor etching chemistry to etch beneath the micro chip 575. In the particular embodiment illustrated at least a portion of the thickness of the device layer 506 of the micro chips 575 is laterally retained between a plurality of staging bollards 552.

Figure 6C:
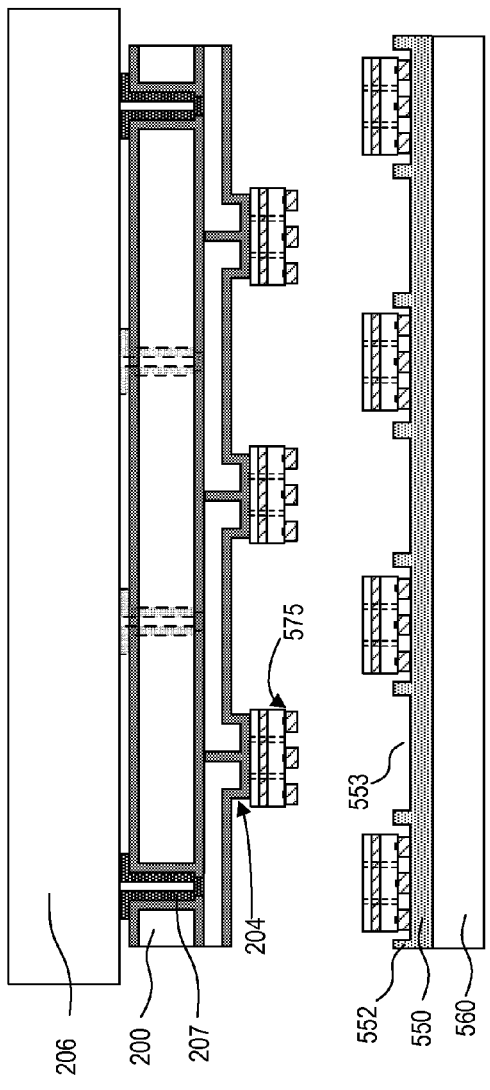
Figure 6D:
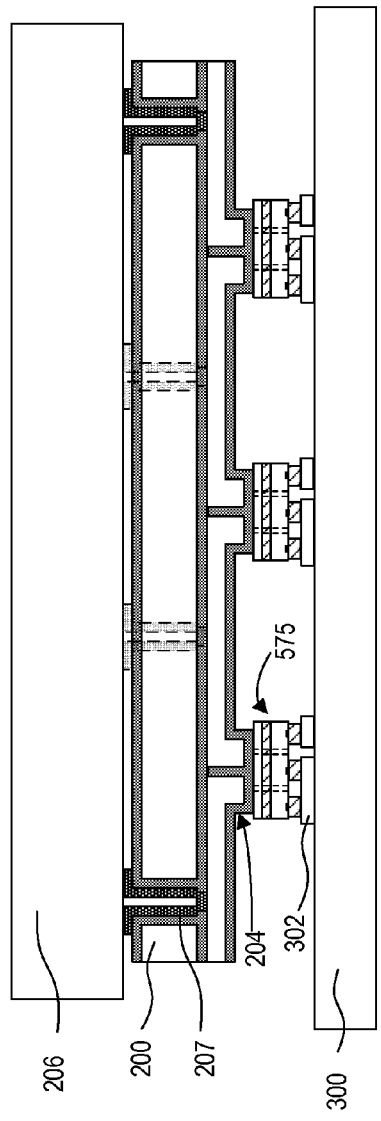
Figure 6E:
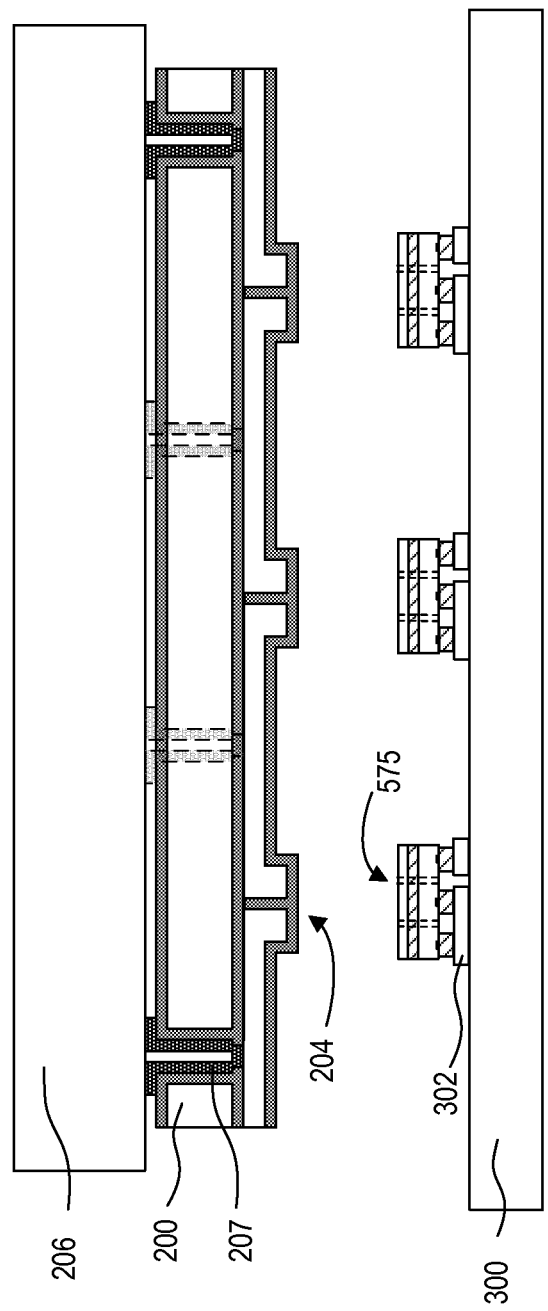

Following removal of the sacrificial release layer 540, the released array of micro chips is poised for pick up and transfer to a receiving substrate. FIGS. 6A-6E are cross-sectional side view illustrations for a method of transferring an array of micro chips from a carrier substrate to a receiving substrate in accordance with embodiments of the invention. FIG. 6A is a cross-sectional side view illustration of an array of micro device transfer heads 204 supported by substrate 200 and positioned over an array of micro chips 575 retained within a corresponding array of staging cavities 553 in accordance with an embodiment of the invention. The array of micro chips 575 are then contacted with the array of transfer heads 204 as illustrated in FIG. 6B. As illustrated, the pitch of the array of transfer heads 204 is an integer multiple of the pitch of the array of micro chips 575. A voltage is applied to the array of transfer heads 204. The voltage may be applied from the working circuitry within a transfer head assembly 206 in electrical connection with the array of transfer heads through vias 207. The array of micro chips 575 is then picked up with the array of transfer heads 204 as illustrated in FIG. 6C. The array of micro chips 575 is then brought into contact with contact pads 302 (e.g. gold, indium, or tin) on receiving substrate 300 as illustrated in FIG. 6D. For example, the receiving substrate may be, but is not limited to, a display substrate, a lighting substrate, a substrate with functional devices such as transistors or ICs, or a substrate with metal redistribution lines.

In one embodiment, an operation is performed to diffuse a bonding layer connecting the array of micro chips 575 with the contact pads 302 while contacting the array of micro chips with the contact pads 302. For example, a silver, gold, indium, or tin bonding layer may be diffused with a silver, gold, indium, or tin contact pad 302, though other materials may be used. In an embodiment, sufficient diffusion to adhere the array of micro chips 575 with the array of contact pads 302 can be achieved at temperatures of less than 200° C. For example, heat can be applied from a heat source located within the transfer head assembly 206 and/or receiving substrate 300.

The operation of applying the voltage to create a grip pressure on the array of micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after creating a phase change in the bonding layer.

Where the transfer heads 204 include bipolar electrodes, an alternating voltage may be applied across a pair of electrodes in each transfer head 204 so that at a particular point in time when a negative voltage is applied to one electrode, a positive voltage is applied to the other electrode in the pair, and vice versa to create the pickup pressure. Releasing the array of micro chips from the transfer heads 204 may be further accomplished with a varied of methods including turning off the voltage sources, lower the voltage across the pair of silicon electrodes, changing a waveform of the AC voltage, and grounding the voltage sources.

In utilizing the various aspects of this invention, it would become apparent to one skilled in the art that combinations or variations of the above embodiments are possible for stabilizing an array of micro devices on a carrier substrate, and for transferring the array of micro devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A stabilization structure comprising:
   a carrier substrate;
   a stabilization layer including an array of staging cavities on the carrier substrate;
   a sacrificial release layer within the array of staging cavities;
   an array of micro devices embedded in the sacrificial release layer;
   wherein the stabilization layer spans directly underneath each micro device and includes an array of staging bollards protruding laterally between the array of micro devices, and each micro device is laterally retained between a plurality of the staging bollards that define a corresponding staging cavity in the stabilization layer;
   wherein each micro device has a maximum width of 1 to 100 µm, each staging cavity has a maximum width between 0.5 µm and 10 µm larger than the maximum width of a corresponding micro device within the staging cavity, each of the staging bollards is 0.5 to 5 µm wide.

2. The stabilization structure of claim 1, wherein an embedded portion of each micro device is completely laterally surrounded by the sacrificial release layer.

3. The stabilization structure of claim 2, wherein the sacrificial release layer spans laterally around a plurality of staging bollards and over a bottom surface of each of the staging cavities.

4. The stabilization structure of claim 2, wherein the sacrificial release layer comprises an oxide or nitride material.

5. The stabilization structure of claim 3, further comprising a sacrificial cap layer over the array of micro devices and the plurality of staging bollards for each of the staging cavities.

6. The stabilization structure of claim 1, wherein the stabilization layer is formed of a thermoset material.

7. The stabilization structure of claim 6, wherein the thermoset material includes benzocyclobutene (BCB).

8. The stabilization structure of claim 1, wherein each staging cavity has a maximum width of 1 to 100 µm.

9. The stabilization structure of claim 2, further comprising a conductive contact on a bottom surface of each micro device.

10. The stabilization structure of claim 9, wherein each micro device is a micro LED device.

11. The stabilization structure of claim 10, further comprising a top conductive contact on a top surface of each micro LED device.

12. The stabilization structure of claim 9, wherein each micro device is a micro chip.

13. The stabilization structure of claim 12, further comprising a plurality of laterally separate bottom conductive contacts on the bottom surface of each micro chip.

14. The stabilization structure of claim 13, wherein at least one of the laterally separate bottom conductive contacts on the bottom surface of each micro chip is electrically connected with a landing pad of the respective micro chip.

15. The stabilization structure of claim 9, wherein each bottom conductive contact comprises a diffusion barrier and a bonding layer between the diffusion barrier and the sacrificial release layer.

16. The stabilization structure of claim 1, wherein each staging cavity shares one of the staging bollards with an adjacent staging cavity.

17. The stabilization structure of claim 1, wherein each staging cavity shares more than one of the staging bollards with an adjacent staging cavity.

18. The stabilization structure of claim 1, wherein each staging cavity shares one of the staging bollards with a plurality of adjacent staging cavities.

* * * * *